US 6,697,296 B2

(12) United States Patent
Matsumoto et al.

(10) Patent No.: US 6,697,296 B2
(45) Date of Patent: Feb. 24, 2004

(54) CLOCK SYNCHRONOUS SEMICONDUCTOR MEMORY DEVICE

(75) Inventors: Junko Matsumoto, Hyogo (JP); Tadaaki Yamauchi, Hyogo (JP); Takeo Okamoto, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/140,937

(22) Filed: May 9, 2002

(65) Prior Publication Data

US 2002/0191480 A1 Dec. 19, 2002

(30) Foreign Application Priority Data

Jun. 13, 2001 (JP) .......................................... 2001-178286

(51) Int. Cl.⁷ ................................................ G11C 8/00
(52) U.S. Cl. ................ 365/233; 365/225.7; 365/230.08
(58) Field of Search ............................... 365/233, 225.7, 365/230.08, 189.05, 189.12, 226, 233.5

(56) References Cited

U.S. PATENT DOCUMENTS 5,450,341 A  *  9/1995  Sawada et al. ......... 365/185.24
5,905,683 A  *  5/1999  McClure ..................... 365/201

FOREIGN PATENT DOCUMENTS

| JP | 61-212116 | 9/1986 |
| JP | 5-167425 | 7/1993 |
| JP | 6-104725 | 4/1994 |
| JP | 8-340020 | 12/1996 |
| JP | 10-255468 | 9/1998 |
| JP | 11-213665 | 8/1999 |

* cited by examiner

*Primary Examiner*—David Lam
(74) *Attorney, Agent, or Firm*—McDermott, Will & Emery

(57) ABSTRACT

In a control circuit and an address buffer circuit, buffer circuits of plural types are provided to each of pin terminals and an input buffer of one type is activated according a state control signal group. In a standby state, current paths of the control buffer circuit and the address buffer circuit are selectively cut off according to a CS cut mode instructing signal stored in a mode register and an internal chip select signal. Furthermore, when a low power consumption mode is specified, a current path of a CLK buffer for generating an internal clock signal is cut off according to an external clock enable signal and a low power mode instructing signal, and the current paths of the control buffer circuit and the address buffer circuit are also cut-off.

20 Claims, 12 Drawing Sheets

BUFFERS OF DIFFERENT SPECIFICATIONS INCLUDED

US 6,697,296 B2

CLOCK SYNCHRONOUS SEMICONDUCTOR MEMORY DEVICE

BACKGROUND OF THE INVENTION

1. Field of the Invention

The present invention relates to a semiconductor device, and particularly, to a configuration of an input circuit inputting an external signal to produce an internal signal. More particularly, the present invention relates to a configuration of an input circuit of a clock synchronous semiconductor memory device operating in synchronization with a clock signal.

2. Description of the Background Art

In order to interface with an external device, a semiconductor device is internally provided with an input circuit inputting a signal, as an interface circuit. Such a signal input circuit has not only a function of buffering a signal transferred from an external device to perform waveform shaping of the signal, but also a function of converting an amplitude and/or voltage level of the external signal depending on an interface of the external device to a signal corresponding to a signal amplitude of internal circuitry. As such an input circuit, one of input circuits with various configurations is used according to the external interface.

FIG. 25 is a diagram showing a first configuration of a conventional input circuit. In FIG. 25, the input circuit includes: a P channel MOS transistor (an insulated gate field effect transistor)PQ1 connected between a power supply node and an internal node ND1, and receiving an external signal EXS at a gate thereof; and an N channel MOS transistor NQ1 connected between internal node ND1 and a ground node, and receiving external signal EXS at a gate thereof.

On internal node ND1, an internal signal INS is generated through buffering of external signal EXS. A power supply voltage Vdd is applied to the power supply node.

The signal input circuit shown in FIG. 25 is a CMOS (Complementary MOS) inverter buffer and converts external signal EXS at TTL (Transistor-Transistor-Logic) level to internal signal INS at CMOS level. External signal EXS may be a signal at CMOS level.

In the configuration of the signal input circuit shown in FIG. 25, a input logical threshold voltage is determined by a function of a beta (β) ratio of MOS transistors PQ1 and NQ1 and threshold voltages of MOS transistors PQ1 and NQ1. Therefore, by adjusting the input logical threshold voltage, external signal EXS at TTL level can be buffered to generate internal signal INS at CMOS level.

FIG. 26 is a diagram showing a second configuration of a conventional input circuit. In FIG. 26, the input circuit includes: a P channel MOS transistor PQ2 connected between a power supply node and a node ND2, and having a gate connected to node ND2; a P channel MOS transistor PQ3 connected between the power supply node and a node ND3, and having a gate connected to node ND2; an N channel MOS transistor NQ3 connected between node ND2 and a ground node, and receiving external signal EMS at a gate thereof; and an N channel MOS transistor NQ4 connected between node ND3 and the ground node, and receiving a reference voltage VREF at a gate thereof.

In the input circuit shown in FIG. 26, MOS transistors PQ2 and PQ3 constitute a current mirror circuit and a current the same in magnitude as a current flowing through MOS transistor PQ2 flows MOS transistor PQ3 (where both have the same size). When external signal EXS is higher than reference voltage VREF, a conductance of MOS transistor NQ3 is made larger than that of MOS transistor NQ4 and a larger current flows through MOS transistor NQ3, compared with a current flowing through MOS transistor NQ4. A current discharged through MOS transistor NQ3 is supplied from MOS transistor PQ2. Therefore, the current of the same magnitude as that supplied by MOS transistor PQ2 is transmitted to MOS transistor NQ4 through MOS transistor PQ3 (where both have the same size). Consequently, a voltage level of internal signal INS from node ND3 goes to H level.

When external signal EXS is lower than reference voltage VREF, to the contrary, a conductance of MOS transistor NQ4 is made larger than that of MOS transistor NQ3, and a drive current of MOS transistor NQ4 turns larger than that flowing through MOS transistor NQ3. Therefore, in this case, MOS transistor NQ4 discharges a larger current than that supplied from MOS transistor PQ3, to drive internal signal INS from node ND3 to L level.

It should be noted that in the input circuit shown in FIG. 26, a constant current source may be provided between a common source of MOS transistors NQ3 and NQ4 and the ground node.

In the case of the input circuit shown in FIG. 26, when external signal EXS is small in signal amplitude, and changes in a small amplitude with reference voltage VREF being a center, internal signal INS at CMOS level can be generated at high speed according to a logical level of external signal EXS. Specifically, when a signal line transmitting external signal EXS thereon is terminated with a terminating resistance and a signal amplitude of external signal EMS is made small, by use of the input circuit of a differential amplification type shown in FIG. 26, internal signal INS at CMOS level can be generated from external signal EXS of a small amplitude reliably.

FIG. 27 is a diagram showing a third configuration of a conventional input circuit. In FIG. 27, the input circuit includes: P channel MOS transistors PQ4 and PQ5 connected in series between a power supply node and a node ND4, and receiving external signal EXS and an internal control signal INCTL at their respective gates; and N channel MOS transistors NQ4 and NQ5 connected in parallel between node ND4 and a ground node with each other, and receiving external gate EXS and internal control signal INCTL at their respective gates.

In the NOR type input circuit shown in FIG. 27, when internal control signal INCTL is at H level, P channel MOS transistor PQ5 is an off state, while N channel MOS transistor NQ5 is an on state, and internal signal INS is fixed at a ground voltage level.

On the other hand, when internal control signal INCTL goes to L level, N channel MOS transistor NQ5 enters an off state, P channel MOS transistor PQ5 enters an on state, and therefore, a CMOS inverter is equivalently formed by MOS transistors PQ4 and NQ4 and internal signal INS is generated according external signal EXS.

The input circuit with the configuration shown in FIG. 27 operates dynamically according to internal control signal INCTL, and a timing at which external signal EXS is taken in is determined by internal control signal INCTL.

The input circuits shown in FIGS. 25 to 27 are appropriately selected for use in a signal input section of a semiconductor device depending on an interface and application thereof.

It should be noted that for a configuration of a input circuit, other different configurations can be available according to interfaces in use, not limited to the configurations as shown in FIGS. 25 to 27. For example, there is available a differential input circuit for an interface through which small amplitude signals are transmitted in the form of complementary signals.

In the event that a configuration of an input circuit is modified according to an individual interface, if a specific input circuit is formed in an individual semiconductor device according to an external interface to be used, such semiconductor devices are to be fabricated that are the same in configuration of internal circuitry and are different in configuration of the respective input circuits. In such a case, layouts have to be individually designed for the respective input circuits, leading to reduced design efficiency. Furthermore, another necessity arises for fabricating semiconductor devices different from each other only in configuration of input circuits in separate fabrication process steps, reducing a fabrication efficiency and in addition, making post-fabrication product management complicated.

Therefore, conventionally, the following process is employed, in which in a master process, input circuits accommodating for plural interfaces are formed in parallel on the same semiconductor chip and in a slice process, an input circuit to be used is connected to internal circuitry and to a signal input node according to an application of interest. Through use of such a master/slice process, a common semiconductor chip can be used for all external interfaces, resulting in improvement on fabrication efficiency. In addition, as for fabrication process steps as well, manufacturing processing is commonly applied on plural kinds of external interfaces in the master process, enabling the fabrication process to be simplified.

Where the master/slice process is employed, masks need to be changed depending on an input circuit to be used to form interconnections in the slice process. Therefore, in the slice process for forming an interconnection in an input circuit finally step, it is required to form an interconnection layer, patterning thereon and others, and a so-called turn around time (TAT) becomes longer, with the result of increased product cost.

Furthermore, another necessity arises for individually preparing specific masks for connection of an input circuit, resulting in increase in product cost, too.

Moreover, as shown in FIGS. 25 and 26, in order to generate an internal signal at high speed to drive the internal signal to a definite state at a faster timing, an input circuit operates at all times in accordance with an external signal. Consequently, such a problem arises that a current is consumed in an unnecessary period. For example, in a case of a semiconductor memory device, a data access is made when a chip select signal CS is activated, while no internal access is made and therefore, it is not particularly required to generate an internal signal when chip select signal CS is in an inactive state. Under such a situation of no access, however, the input circuit continues to operate to generate an internal signal to consume unnecessarily a current, leading to a problem of disabling achievement of a low current consumption. Such problem becomes more serious when a low power consumption mode is specified that requests a low current consumption, such as a sleep mode in a semiconductor memory device.

Furthermore, where an external signal is taken in to generate an internal signal in synchronization with a clock signal, it is required that a buffer circuit at a first input stage generates an internal signal at as fast a timing as possible to transmit the internal signal to internal circuitry. This is because it is necessary that a signal generated by the buffer circuit at the first input stage is latched or determined on a logic level thereof in synchronization with a clock signal.

SUMMARY OF THE INVENTION

It is an object of the present invention to provide a semiconductor device having an input circuit capable of reducing a turn around time, and capable of accommodating for plural different input interfaces.

It is another object of the present invention to provide a semiconductor device having an input circuit capable of reducing a consumed current without delaying a timing of generating an internal signal.

It is still another object of the present invention to provide a clock synchronous semiconductor memory device of a low power consumption.

A semiconductor device according to a first aspect of the present invention includes: a plurality of input buffers each different in form from other(s); and a program circuit for generating a signal alternatively setting the plurality of input buffers to an operable state. The plurality of input buffers are selectively set to an operable state according to an output signal of the program circuit and drive an internal node according to a signal received when made active.

A semiconductor device according to a second aspect of the present invention includes: a signal input circuit including an input buffer buffering a signal provided externally to generate an internal signal when activated; a register circuit for storing a signal specifying whether control on the input buffer by an operation activating signal instructing that the external signal is valid is to be enabled; and an activation control circuit for selectively activating the signal input circuit according to the operation activating signal and the stored signal in the register circuit. Where the stored signal in the register circuit indicates that control on the signal input circuit by the operation activating signal is enabled, the activation control circuit selectively activates the signal input circuit according to the operation activating signal. Where the stored signal in the register circuit indicates that control on the signal input circuit by the operation activating signal is to be disabled, the activation control circuit sets the signal input circuit to an operating state independently of the operation activating signal.

A semiconductor device according to a third aspect of the present invention includes: a buffer circuit for buffering a signal provided externally when activated; a clock buffer for generating an internal clock signal according to an external clock signal when a clock enable signal is activated; clock detection circuitry for detecting whether the clock enable signal is kept inactive for a prescribed period in a low power operating mode; and a control circuit for setting the buffer circuit and the clock buffer to an inactive state in response to a detection signal of the clock detection circuitry.

By selectively setting the plurality of input buffers each different in configuration from other(s) to be operable according to the output signal of the program circuit, a semiconductor device adaptable to any of external interfaces can be fabricated in the same fabrication process steps. Furthermore, in a post-fabrication test, a test on internal circuitry can be effected by selectively setting the plurality of input circuits operable using a tester.

Moreover, only an input circuit corresponding to a desired external interface can be operated through a mere program of the program circuit, thereby enabling reduction in turn around time as well as fabrication cost.

Furthermore, by setting whether or not the input circuit is to be controlled in accordance with the operation activating signal according to a stored signal in the register circuit, a semiconductor device of a low consumed current can be achieved readily, that is adapted to a usage application without modifying an internal configuration of the device to any extent.

Moreover, in the low power mode, when the clock enable signal is held in an inactive state for a period of a prescribed number of cycle(s), the buffer circuit and the clock buffer circuit are disabled. Consequently, since no operation of generating an internal signal according to an external signal is performed in the low power operation mode, a consumed current can be reduced more in the low power mode through ceasing of such unnecessary operation of the buffer circuits.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[First Embodiment]

Figure 1:
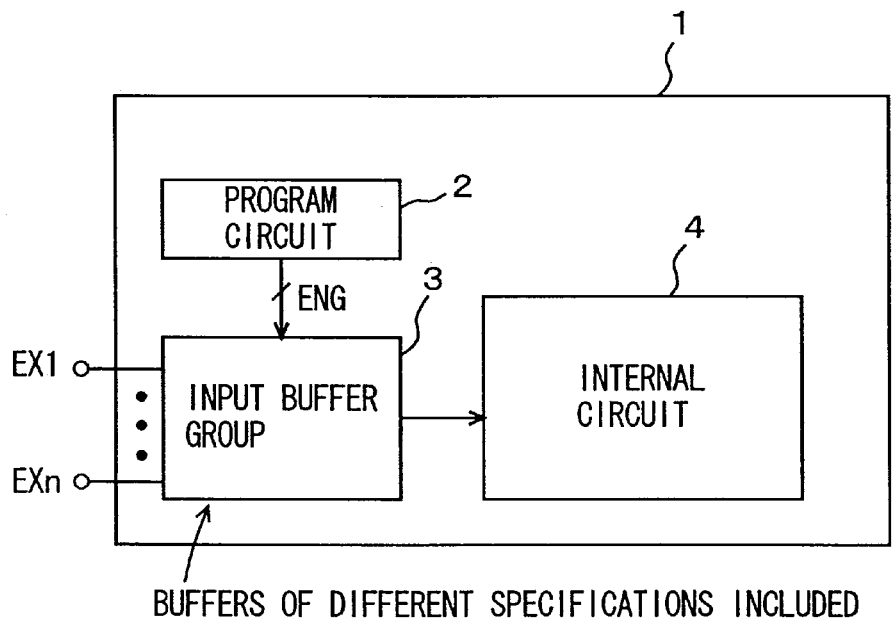
FIG. 1 is a block diagram schematically showing an entire configuration of a semiconductor device according to a first embodiment of the present invention.

FIG. 1 is a block diagram schematically showing an entire configuration of a semiconductor device according to a first embodiment of the present invention. In FIG. 1, a semiconductor device 1 includes: an input buffer group 3 including input buffers for different interface specifications; a program circuit 2 for generating an operation control signal group ENG for selectively activating buffers included in input buffer group 3; and an internal circuit 4 for performing a prescribed operation according to an internal signal applied from input buffer group 3.

In input buffer group 3, plural input buffers corresponding to respective interfaces are provided corresponding to each of input nodes EX1 to EXn. One of the plural buffers, provided to one input node, each different in configuration or different in interface specification from other(s), is activated according to state control signal group ENG from program circuit 2. Therefore, in input buffer group 3, input buffers having different configurations are manufactured through the same fabrication process steps to the final manufacturing step. By selectively setting input buffers included in input buffer group 3 to an operable state according to state control signal group ENG from program circuit 2, an input buffer corresponding to an external interface applied to the semiconductor device can be set to a normally operable state all the times.

Only by programming the states of state control signal group ENG of program circuit 2, an input buffer adapted to an external interface to be used can be set to an operable state in a short time. Furthermore, in input buffer group 3, each input buffer can be tested while setting it in an operable state at a wafer level to ensure the reliability of the input buffers, enabling reduction in a turn around time.

Figure 2:
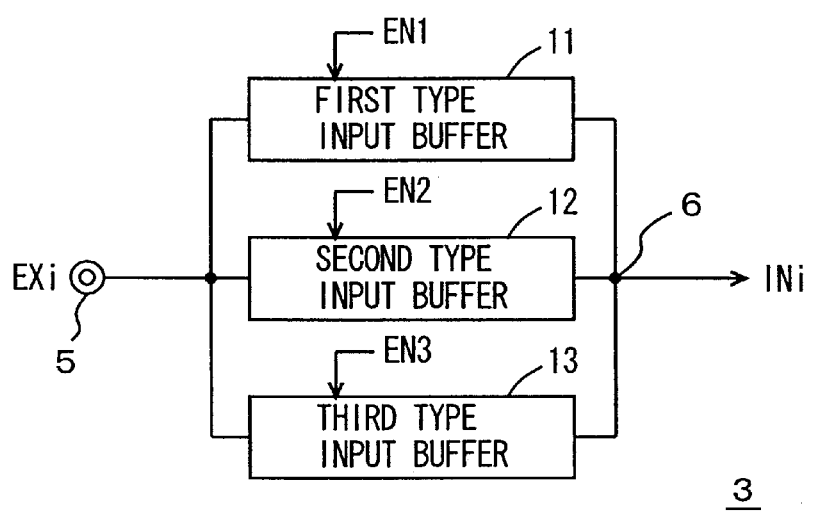
FIG. 2 is a block diagram schematically showing an example of the configuration of an input buffer group shown in FIG. 1.

FIG. 2 is a block diagram schematically showing a configuration of an input buffer circuit provided corresponding to one signal input node. In FIG. 2, the input buffer circuit in input buffer group 3 includes a first type input buffer 11, a second type input buffer 12 and a third type input buffer 13 coupled in parallel between a signal input node 5 and an internal node 6. State control signals EN1, EN2 and EN3 from program circuit 2 shown in FIG. 1 are applied to input buffers 11, 12 and 13, respectively. Input buffers 11, 12 and 13 are each set to an operable state when corresponding state control signals EN1, EN2 and EN3 are active and buffer external signals EXi to generate internal signal INi when activated.

State control signal EN1 is applied commonly to first type input buffers included input buffer group 3, state control signal EN2 is applied commonly to second type input buffers included input buffer group 3 and state control signal EN3 is applied commonly to third type input buffers included input buffer group 3. First type input buffers 11, second type input buffers 12 and third type input buffers 13 are disposed in a set to each of input terminals EX1 to EXn.

By providing program circuit 2 commonly for input buffers of input buffer group 3, an input buffer corresponding to a specification of an applied external interface can be set to an operable state in input buffer group 3 without increasing a circuit occupancy area.

Figure 3:
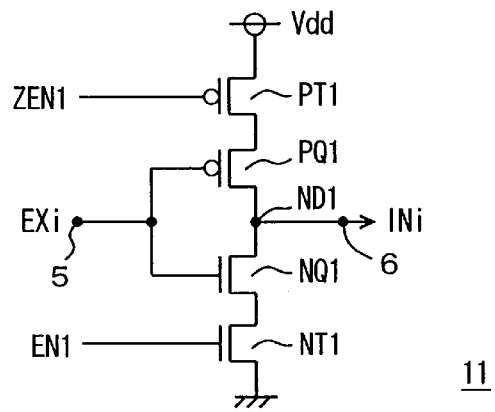
FIG. 3 is a diagram showing an example of the configuration of a first type of an input buffer shown in FIG. 2.

FIG. 3 is a diagram showing an example configuration of first type input buffer 11. First type input buffer 11 shown in FIG. 3 includes: MOS transistors PQ1 and NQ1 having respective gates connected to signal input node 5; a P channel MOS transistor PT1 connected between a power supply node and MOS transistor PQ1, and receiving a complementary state control signal ZENi at a gate thereof; and an N channel MOS transistor NT1 connected between MOS transistor NQ1 and a ground node, and receiving state control signal ENi at a gate thereof.

Figure 25:
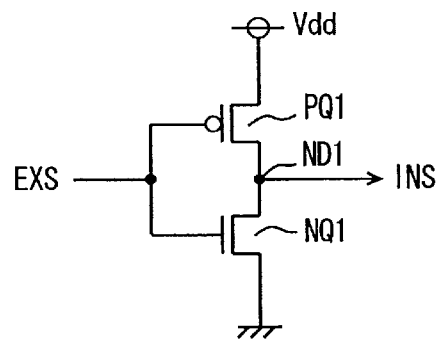
FIG. 25 is a diagram showing a first configuration of a conventional input circuit.

First type input buffer shown in FIG. 3 corresponds in configuration to the input buffer circuit shown in FIG. 25. When state control signal ENi is at H level and complementary state control signal ZENi is at L level, MOS transistors PT1 and NT1 become conductive, and internal signal INi is generated onto internal node 6 according to external signal EXi by MOS transistors PQ1 and NQ1.

When state control signals ENi and ZENi are at L level and H level, respectively, MOS transistors PT1 and NT1 enter an off state and node ND1 is held in a high impedance state regardless of the external signal EXi.

Figure 4:
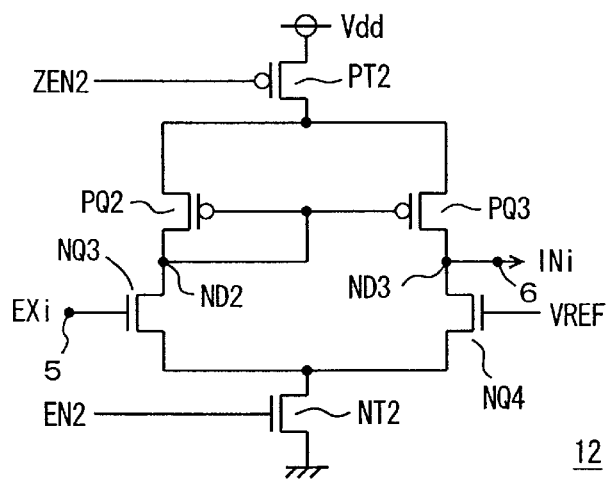
FIG. 4 is a diagram showing an example of the configuration of a second type of the input buffer shown in FIG. 2.
Figure 26:
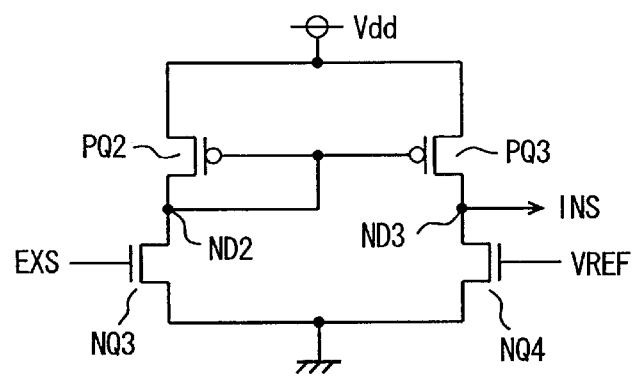
FIG. 26 is a diagram showing a second configuration of a conventional input circuit.

FIG. 4 is a diagram showing an example of the configuration of second type input buffer 12 shown in FIG. 2. Second type input buffer shown in FIG. 4 corresponds in configuration to the input buffer shown in FIG. 26. In FIG. 4, a P channel MOS transistor PT2 receiving complementary state control signal ZEN2 at a gate thereof is provided between P channel MOS transistors PQ2 and PQ3 constituting a current mirror circuit and a power supply node, and furthermore, an N channel MOS transistor NT2 receiving state control signal EN2 at a gate thereof is provided between a common source node of N channel MOS transistors NQ3 and NQ4 constituting a differential stage and a ground node.

In the case of the configuration of the input buffer circuit shown in FIG. 4, when state control signals EN2 and ZEN2 are at L level and at H level, respectively, MOS transistors PT2 and NT2 both enter an off state and node ND3 is kept in a high impedance state.

When state control signal EN2 and ZEN2 are at H level and at L level, respectively, MOS transistors NT2 and PT2 enter an on state, a common source of MOS transistors PQ2 and NQ2 is coupled to the power supply node, while the common source of MOS transistors NQ3 and PQ3 is coupled to the ground node, and the input buffer circuit enters an operable state to generate internal signal INi onto internal node 6 in accordance with the external signal EXi.

It should be noted that in the configuration of the differential input buffer shown in FIG. 4, a current source transistor may be connected in series with MOS transistor NT2. MOS transistor NT2 may have a function of the current source transistor.

Figure 5:
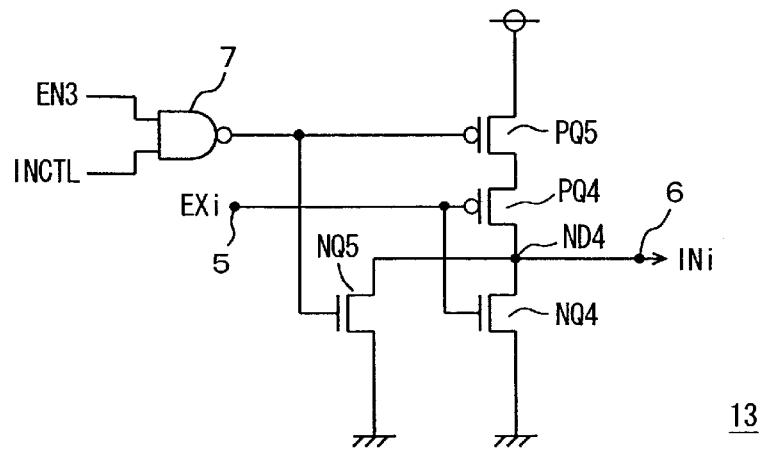
FIG. 5 is a diagram showing an example of the configuration of a third type of the input circuit shown in FIG. 2.
Figure 27:
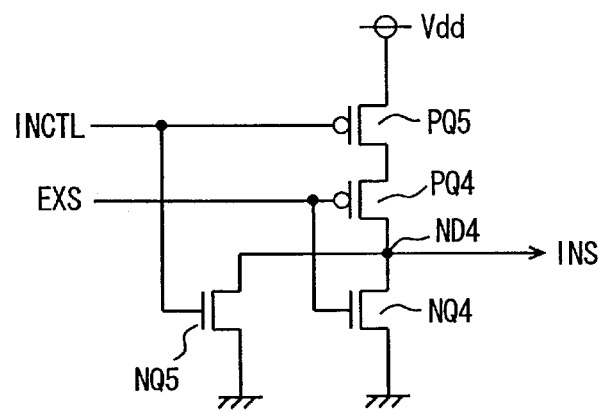
FIG. 27 is a diagram showing a third configuration of a conventional input circuit.

FIG. 5 is a diagram showing an example of the configuration of third type input circuit 13 shown in FIG. 2. Third type input buffer shown in FIG. 5 corresponds in configuration to the NOR input buffer shown in FIG. 27. Third type input buffer 13 shown in FIG. 5 is different from that shown in FIG. 27 in the following point. An output signal of a NAND circuit 7 receiving state control signal EN3 and internal control signal INCTL is applied to the gate of a MOS transistor PQ5 connected to a power supply node, and an output signal of NAND circuit 7 is also applied to the gate of an N channel MOS transistor NQ5 fixing internal node 6 at the ground voltage level when the input buffer is set in an inactive state. The other parts of the configuration are the same as those of the configuration shown in FIG. 27, the same reference numerals are attached to corresponding components and detailed description thereof is omitted.

In the configuration of input buffer 13 shown in FIG. 5, when state control signal EN3 is at L level, an output signal of NAND circuit 7 is fixed at H level, MOS transistor PQ5 is in an off state while MOS transistor NQ5 is in an on state, and node ND4 is fixed at L level regardless of a logical level of an external signal. An input buffer of another type is connected to internal node 6.

Connection of input buffers 11, 12 and 13 to internal node 6 is a wired OR connection. Therefore, even if the output signal of the input buffer 13 is fixed to L level when not used, internal node 6 is driven to a corresponding logical level according to an output signal of another input buffer in use. Thus, even if an output node of NOR input buffer 13 is fixed at L level when not used, internal signal INi corresponding to external signal EXi is generated correctly by another input buffer set in an operable state.

When state control signal EN3 is set to H level, NAND circuit 7 operates as an inverter and an output signal thereof changes according to internal control signal INCTL. Where input buffer 13 is set to an operable state according to state control signal EN3, when internal control signal CNTL is at H level, MOS transistor PQ5 is in an on state while MOS transistor NQ5 is in an off state, and input buffer circuit 13 drives internal node 6 according to external signal EXi, to generate internal signal INi.

When internal control signal INCTL is at L level, the output signal of NAND circuit 7 goes to H level, MOS transistor PQ5 enters an off state while MOS transistor NQ5 enters an on state, and accordingly internal node 6 is fixed at L level regardless of a state of external signal EXi.

When an internal clock enable signal INTCKE controlling generation of an internal clock signal in a clock synchronous semiconductor memory device described later is used as internal signal INCTL, operation of an input buffer can be ceased while generation of an internal clock is ceased, to reduce the current consumption.

By applying state control signals EN1 to EN3 corresponding to types of input buffers from program circuit 2 are commonly applied to input buffers in respective types of input buffer group 3 shown in FIG. 1, input buffers can be selectively set to operable state, allowing the use of the input buffers corresponding to an external interface.

Since non-used input buffers 11 and 12 are set in an output high impedance state, no adverse influence is exerted on internal node 6. Furthermore, when input buffer 13 is not used, another input buffer 11 or 12 drives internal node 6 according to external signal EXi. Therefore, no adverse influence is exerted on an internal operation either, even if input buffers 11 to 13 are connected in parallel to internal node 6 and are alternatively set to an operable state according to state control signals EN1 to EN3.

Figure 6:
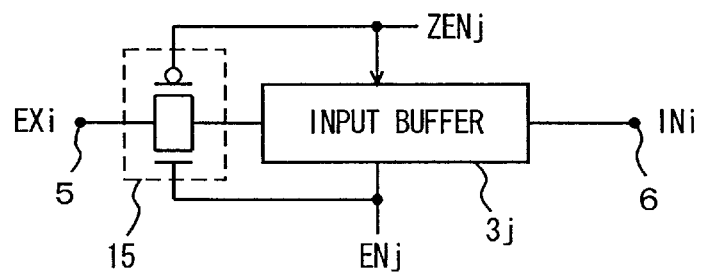
FIG. 6 is a diagram schematically showing an example of the modification of the input buffer shown in FIG. 2.

In the configurations of the input buffers shown in FIG. 3 to 5, when a gate capacitance of an input buffer not used is connected to signal input node 5 and a load capacitance of signal input node 5 increases, an input impedance may possibly increase. In this case, a configuration may be employed as shown in FIG. 6 in which a CMOS transmission gate 15 is provided between input buffer 3j and signal input node 5, and input buffer 3j not used is isolated from signal input node 5 according to state control signals ENj and ZENj. When such a configuration is employed, although a junction capacitance of CMOS transmission gate 15 is coupled to signal input node 5, the junction capacitance is sufficiently smaller than the gate capacitance of MOS transistor of input buffer 3j. Therefore, a parasitic capacitance of signal input node 5 can be made sufficiently low, thereby enabling suppression of increase in load on signal input node 5 reliably even when input buffers of plural types are provided in parallel corresponding to one signal input node.

Figure 7:
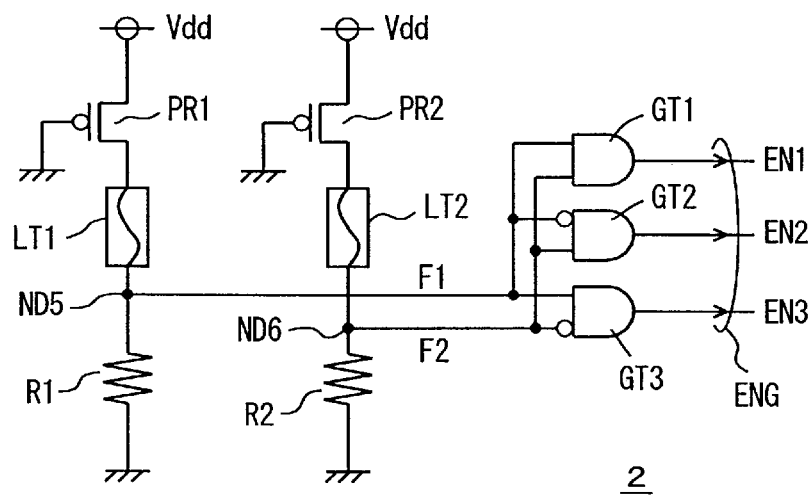
FIG. 7 is a diagram showing an example of the configuration of a program circuit shown in FIG. 1.

FIG. 7 is a diagram showing an example of the configuration of program circuit 2 shown in FIG. 1. In FIG. 7, program circuit 2 includes: a P channel MOS transistor PR1 and a link element (a fuse element) LT1 connected in series between a power supply node and node ND5; a resistance element R1 connected between node ND5 and a ground node; a P channel MOS transistor PR2 and a link element LT2 connected in series between the power supply node and a node N6; and a resistance element R2 connected between node ND6 and the ground node.

The gates of P channel MOS transistors PR1 and PR2 are connected to the ground node, MOS transistors PR1 and PR2 function as current limiting elements to supply a very small current. Resistance elements R1 and R2 are pull-down resistors with a high resistance value. Link elements LT1 and LT2 are fuse elements that can be blown off by an energy beam such as a laser beam.

Program circuit 2 further includes gate circuits GT1 to GT3 each receiving signals F1 and F2 on node ND5 and ND6. Gate circuit GT1 drives state control signal EN1 to H level when signal F1 and F2 are both at H level. When signal F1 is at L level and signal F2 is at H level, gate circuit GT2 drives state control signal EN2 to H level. When signal F1 is at H level and signal F2 is at L level, gate circuit GT3 drives state control signal EN3 to H level. Gate circuits GT1 to GT3 constitute a decode circuit and decode the input buffer identifying information programmed by link elements to drive a state control signal corresponding to the decoding result to an active state.

When link element LT1 is conductive, a current flows in resistance element R1, and the signal F1 on node ND5 attains H level. When link element LT1 is blown off, node ND5 is pulled down to the ground voltage level by resistance element R1, and the signal F1 attains L level.

Similarly, when link element LT2 is conductive, the signal F2 goes to H level, while the signal F2 goes to L level when link element LT2 is in a blown off state. By selectively setting (programming) link elements LT1 and LT2 to a conductive state and a blown off state, one of state control signal EN1 to EN3 can be driven to an active state (H level) to select a type of the input buffer.

Program circuit 2 is provided commonly to input buffers of input buffer group 3 and a circuit occupancy area can be reduced, as compared with a configuration in which link elements are provided to each of input buffers. Furthermore, by forcing the signals F1 and F2 to H level or L level in a test mode of operation using a tester, to drive alternatively state control signals EN1 to EN3 to an active state, the semiconductor device can be tested with an input buffer of a desired type set in an operating state.

It should be noted that input buffers of three different types are disposed corresponding to one signal input node. However, the number of input buffers disposed corresponding to one signal input node is not limited to 3, but it is sufficient to determine the number of input buffers disposed corresponding to one signal input node appropriately.

It should be also noted that a following configuration may be employed. Two kinds of the NOR input buffers shown in FIG. 5 are utilized as input buffers with the ratio of the circuits changed. There are prepared the circuits the same in circuit configuration but different in ratio, or different in input logic threshold voltage, as input buffers that are different in type and correspond to different interfaces. Specifically, a configuration may be used in which ratios of MOS transistors in NOR circuits are changed with each other to make different an input logic threshold voltage of each NOR input buffer from other(s). An input buffer for an input signal of a TTL level and an input buffer for an input signal at a CMOS level of 1.8 V, for example, are prepared, and these prepared input buffers are selectively driven to an operable state according to state control signals. By use of such input buffers, a common chip can accommodate for interfaces for a TTL level signal and for a CMOS level signal.

Therefore, an input buffer of a different type has only to be a circuit corresponding to a different interface, regardless of whether or not a circuit configuration of the input buffer circuit is the same.

Where input buffers are used in a clock synchronous semiconductor device, selection is made on input buffers to which an external clock enable signal EXCKE is inputted, according to state control signals EN and ZEN. As for a CLK buffer receiving external clock EXCLK, selection is made in accordance with a signal obtained by taking a logical product (AND) of a clock enable signal and state control signal.

As for an input buffer receiving a different control signal and an address signal, selection is made in accordance with a signal obtained by taking a logical product (AND) of internal clock enable signal INCKE and state control signal EK. The functions of these other control signals as described above will be detailed later, but these signals control the generation of an internal clock signal to control an internal state of a semiconductor memory device. For example, internal control signal INCTL corresponds to internal clock enable signal INTCKE.

Where activation/deactivation of input buffers is performed according to a different internal control signal, selection/non-selection on input buffers, or a use/non-use state of input buffers is set by a signal obtained by performing a logic operation on a corresponding internal control signal and a corresponding state control signal. By the use of a logic operation on an internal control signal and a state control signal, no necessity arises for providing transistors dedicated for setting use/non-use of input buffers, thereby enabling suppression of increase in circuit occupancy area.

As described above, according to the first embodiment of the present invention, such a configuration is employed that input buffers having respective plural types are provided in parallel and an input buffer having type among input buffers of the plural types is selected by a fuse program. Thus, a fabrication process can be simplified to reduce a turn around time and to decrease a fabrication cost.

[Second Embodiment]

Figure 8:
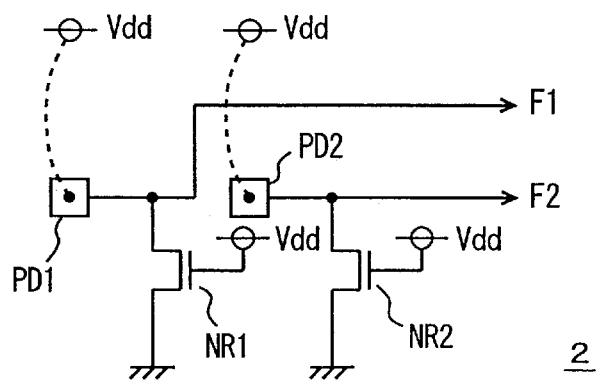
FIG. 8 is a diagram showing an example of the configuration of a program circuit according to a second embodiment of the present invention.

FIG. 8 is a diagram schematically showing an example of the configuration of program circuit 2 according to a second embodiment of the present invention. In FIG. 8, program circuit 2 includes: an N channel MOS transistor NR1 connected between a bonding pad PD1 and a ground node, and having a gate coupled to a power supply node; and an N channel MOS transistor connected between a bonding pad PD2 and a ground node, and having a gate connected to the power supply node. MOS transistors NR1 and NR2 serve as pull-down elements and have driving currents thereof made sufficiently small and channel resistance values thereof made sufficient large.

Bonding pads PD1 and PD2 are selectively connected to the power supply node through a bonding wire to generate signal F1 and F2. Signals F1 and F2 are applied to gate circuits GT1 to GT3 of the program circuit shown in FIG. 7 and decoded to activate one of state control signals EN1 to EN3.

It should be noted that where a bonding pad is connected to a power supply node through a bonding wire, a leakage current flows from the power supply node to a ground node. In order to prevent the leakage current, an N channel MOS transistor receiving an output signal of an inverter inverting a signal on bonding pad PD at a gate thereof may be connected in series with MOS transistor NR. Where boding pad PD is connected to the power supply node, an output signal of the inverter goes to L level, a MOS transistor for cutting off the leakage current enters an off state, thereby enabling cutting off of a leakage current path between the boding pad PD and the ground node.

As shown in FIG. 8, by selectively setting a potential of a bonding pad using a bonding wire, an input buffer of a desired type can be activated even where input buffers having plural types are provided.

It should be noted that the shown configuration is provided by way of example, in which an input buffer to be used is determined by setting a potential of a boding pad shown in FIG. 8. Other configuration can be used. For example, a configuration can be used in which boding pad PD is connected to the ground node through a bonding wire.

Where bonding pads PD1 and PD2 are used, no necessity arises for a laser blowing step for programming link elements. Therefore, a boding wires has only to be routed in package assembly step, and thus, the signals F1 and F2 can be readily generated to set an input buffer of a desired type to an operable state

[Third Embodiment]

Figure 9:
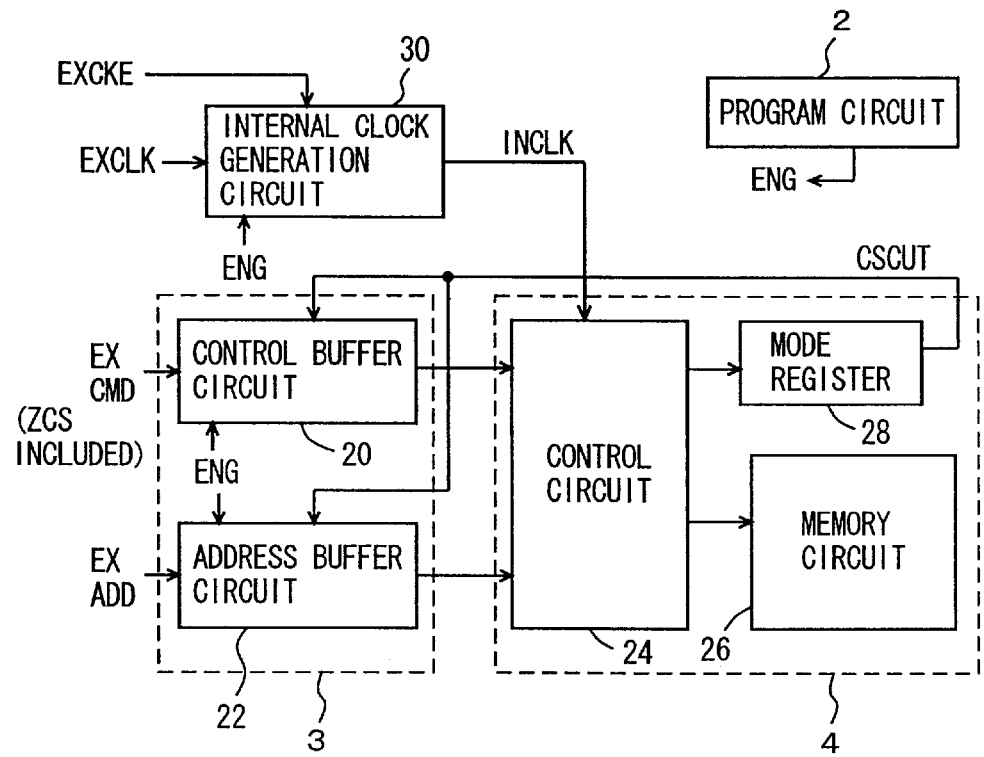
FIG. 9 is a block diagram schematically showing a configuration of a main portion of a semiconductor memory device according to a third embodiment of the present invention.

FIG. 9 is a block diagram schematically showing an entire configuration of a semiconductor memory device according to a third embodiment of the present invention. In FIG. 9, input buffer group 3 includes: a control buffer circuit 20 receiving an external control signal (a command) EXCMD and state control signal group ENG from program circuit 2; and an address buffer circuit 22 receiving an external address signal EXADD. State control signal group ENG from program circuit 2 is also applied to address buffer circuit 22.

The semiconductor memory device further includes an internal clock generation circuit 30 for generating an internal clock signal INCLK according to external clock signal EXCLK when an external clock enable signal EXCKE is active. When external clock enable signal EXCKE is inactive, internal clock generation circuit 30 ceases an operation for generating internal clock INCLK to cease an operation of internal circuitry 4.

Internal circuitry 4 includes: a control circuit 24 taking in internal signals from control buffer 20 and address buffer 22 in synchronization with internal clock signal INCLK to generate an internal control signal according to the taken in signal; a memory circuit operating under control of control circuit 24; and a mode register 28 for storing data (a signal) specifying an operating condition for the semiconductor memory device.

When a control signal from control buffer circuit 20 and a specific address signal bit from address buffer circuit 22 are in a specific combination of logical states (at a rise of internal clock signal INCLK, for example) and specify a mode register set mode, control circuit 24 stores a specific address signal bit of the address signal from address buffer circuit 22 or a specific input data bit into mode register 28.

In the third embodiment, mode register 28 is used to store a signal specifying a state of a CS cut mode instructing signal CSCUT for deactivating control buffer circuit 20 and address buffer circuit 22 when a chip select signal CS is inactive. When chip select signal CS is in an active state at H level, the semiconductor memory device is in an active state and determines an external signal valid and takes in the external signal. When chip select signal CS is in an inactive state at L level, the semiconductor memory device is in inactive state, neglects all of external signals and performs no new internal operation.

Chip select signal CS is included in external command EXCMD. When a complementary chip select signal ZCS is in an inactive state at L level, it is specified that the semiconductor memory device is selected. When chip select signal ZCS is at L level, control circuit 24 determines that a valid command/address signal is applied and executes various operations in accordance with the command.

Memory circuit 26 includes; a plurality of memory cells arranged in rows and columns, and a memory cell select circuit for selecting a memory cell. A control circuit 24 includes a latch circuit taking in and latching an internal signal applied from control buffer circuit 20 in synchronization with internal clock signal INCLK; a command decoder for determining an operation mode specified according to the latched internal controlled signal; and an address latch for latching an internal address signal outputted by address buffer circuit 22 according to a result of the determination by the command decoder.

Figure 10:
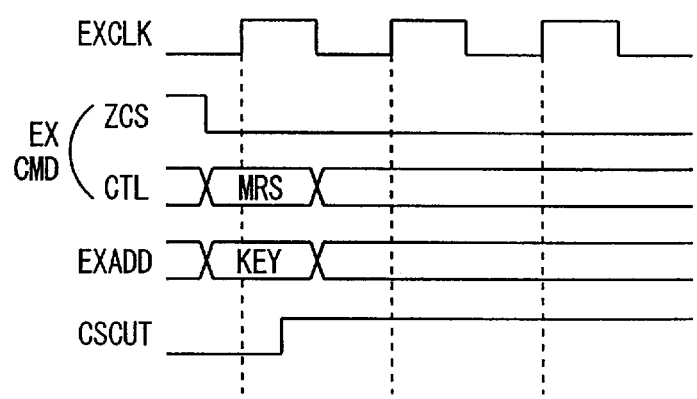
FIG. 10 is a timing chart representing operation of the semiconductor device shown in FIG. 9.

FIG. 10 is a timing chart representing an operation sequence for setting CS cut mode instructing signal in mode register 28 shown in FIG. 9. As shown in FIG. 10, external command EXCMD and external address signal EXADD are set to prescribed states in synchronization with external clock signal EXCLK. External command EXCMD includes chip select signal ZCS and another control signal CTL. When chip select signal ZCS is at L level, it is specified that a valid command is applied. When the control signal CTL is set to a prescribed logical state and further, a prescribed bit KEY of external address signal EXADD is set to a prescribed state, a mode register set command is applied. An operation content to be set is determined by the specific bit (KEY) of address signal EXADD (a register circuit of the mode register is specified).

When a mode register set command MRS is applied and a mode of storing a CS cut mode instructing signal is specified, CS cut mode instructing signal CSCUT is set to L level or H level in mode register 28 according to a prescribed external address signal bit or a signal (data) on a prescribed data input node. FIG. 10 shows the state that when the CS cut mode is specified and CS cut mode instructing signal CSCUT is set to H level, so that when chip select signal ZCS is at H level, control buffer circuit 20 and address buffer circuit 22 are deactivated to be non-operable and have the current flowing paths therein cut off.

Hence, when chip select signal ZCS is at H level, the semiconductor memory device is in a non-selected state and accepts no request for access. Therefore, in this situation, a current path is shut off in input buffer group 3, thereby reducing a current consumption.

Figure 11:
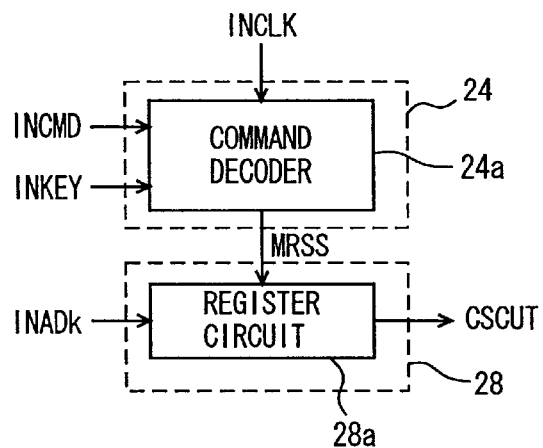
FIG. 11 is a block diagram schematically showing a configuration of a section related to a CS cut mode in the configuration shown in FIG. 9.

FIG. 11 is a block diagram schematically showing a configuration of a section related to generation of a CS cut mode instructing signal in internal circuitry 4 shown in FIG. 9. In FIG. 11, control circuit 24 includes a command decoder 24a for decoding an internal command INCMD from control buffer circuit 20 shown in FIG. 9 and an internal address key INKEY from address buffer circuit 22 shown in FIG. 9 in synchronization with internal clock signal INCK. When internal command INCMD and internal address key INKEY are set to prescribed logical states at a rise of internal clock signal INCLK, command decoder 24a determines that a CS cut mode setting operation among mode register set modes is specified and activates a mode register set mode instructing signal MRSS.

Mode register 28 includes a register circuit 28a for storing a prescribed address signal bit INADk according to mode register set mode instructing signal MRSS from command decoder 24a to generate CS cut mode instructing signal CSCUT. Therefore, when a mode register set mode is specified, a specific address signal bit is stored as a CS cut mode instructing signal into register circuit 28a.

Data specifying column latency, a burst length or other may be simultaneously taken in according to internal command INCMD and internal address key INKEY. Here, the column latency is the number of clock cycles required between the cycle at which a read command instructing data read is applied and the cycle at which valid data is outputted externally and the burst length indicates the number of data bits accessed successively per data terminal when one access command is applied.

CS cut mode instructing signal may also be exclusively specified according to specific internal address key INKEY in a mode register set command. This is achieved by setting a combination of internal address key INKEY for the CS cut mode to a different combination from the combination for the mode of specifying the column latency, or the burst length data or the like.

Figure 12:
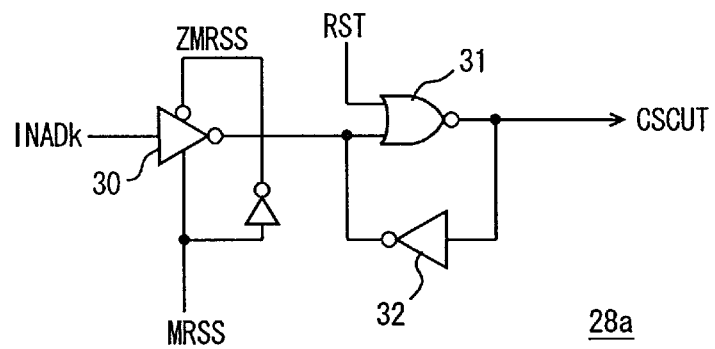
FIG. 12 is a diagram showing an example of the configuration of a register circuit shown in FIG. 11.

FIG. 12 is a diagram showing an example of the configuration of the register circuit shown in FIG. 11. In FIG. 12, register circuit 28a includes: a tri-state inverter buffer 30 inverting specific internal address signal bit INADk according to mode register set mode instructing signal MRSS and complementary register set mode instructing signal ZMRSS; a NOR circuit 31 receiving reset signal RST and an output signal of tri-state inverter buffer 30 to generate CS cut mode instructing signal CSCUT; and an inverter 32 inverting CS cut mode instructing signal CSCUT outputted by MOR circuit 31 to transmit the inverted signal to the output of tri-state inverter buffer 30.

Reset signal RST is a signal to be activated upon system resetting or power up. Therefore, CS cut mode instructing signal CSCUT is set at L level when reset. CS cut mode instructing signal CSCUT is deactivated when set at L level, an input buffer generates an internal signal according to an external signal even when chip select signal ZCS is in an inactive state. Therefore, the CS cut mode is set to an inactive state in a default state.

In the mode register set mode, when internal address signal bit INADk is set to H level, CS cut mode instructing signal CSCUT goes to H level, and when chip select signal ZCS is at H level, current flowing paths are cut off in buffer circuits 20 and 22. In this case, however, a CS buffer receiving an external chip select signal EXZSC operates normally and does not receive CS cut mode instructing signal CSCUT.

It should be noted that a signal on a specific data input node may be applied to the register circuit, in place of the address signal bit.

Figure 13:
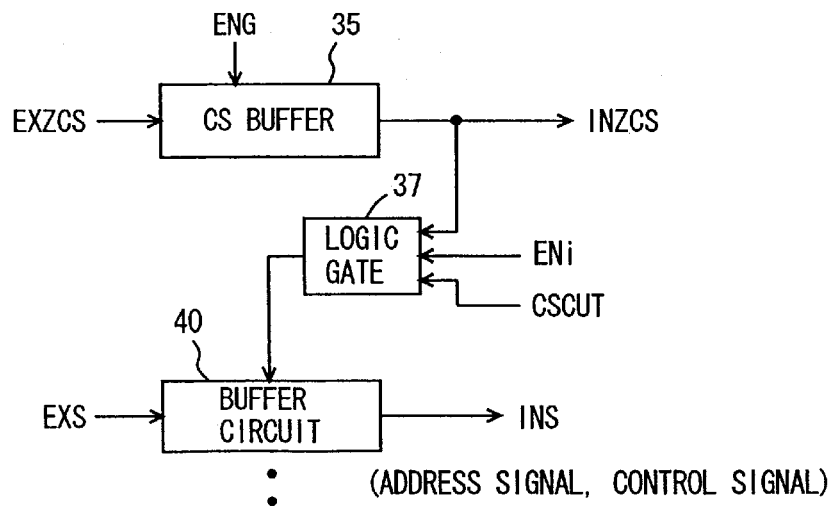
FIG. 13 is a block diagram schematically showing a configuration of a buffer circuit control of the third embodiment of the present invention.

FIG. 13 is a block diagram schematically showing an example of a specific configuration of control buffer circuit 20 and address buffer circuit 22 shown in FIG. 9. In FIG. 13, control buffer circuit 20 includes: a CS buffer 35 receiving external chip select signal EXZCS to generate internal chip select signal INCS; a logic gate 37 receiving internal chip select signal INCS, state control signal ENi and CS cut mode instructing signal CSCUT; and a buffer circuit 40 selectively set to an operating state according to an output signal of logic gate 37 to generate internal signal INS according to external signal EXS.

CS buffer 35 includes input buffers of plural types, one of which is set to an operable state by state control signal group ENG.

Buffer circuit 40 includes an input buffer circuit of one type among the input buffers of plural types.

Logic gate 37 has a different configuration according to a configuration of a section for cutting off a current path. When state control signal ENi specifying an input buffer of one type and CS cut mode instructing signal CSCUT are both in an active state at H level, logic gate 37 cuts off a current path of buffer circuit 40 to cease an operation of generating internal signal IN when internal chip select signal INCS is in a non-selected state at L level. When state control signal ENi is in an inactive state, logic gate 37 sets buffer circuit 40 to an non-operating state (cuts off an operating current flowing path) regardless of states of internal chip select signal INCS and CS cut mode instructing signal CSCUT.

CS buffer 35 is a circuit generating a basic signal of the CS cut mode, and an input buffer of a type specified by state control signal group ENG is set to an operable state therein to generate internal chip select signal INCS according to external chip select signal EXZCS.

Internal signal INS generated by buffer circuit 40 is one of an address signal bit, an input data bit and control signals except chip select signal INCS. In internal clock generation circuit 30, an input buffer is only selectively set to an operating state according to state control signal group ENG, not subject to control by the chip select signal. This is because it is necessary to determine when chip select signal CS is activated or deactivated at an edge of a clock signal and therefore, and it is necessary to operate internal clock generation circuit 30 independently of chip select signal CS. In internal clock generation circuit 30, operation for generating an internal clock signal is controlled by clock enable signal EXCKE provided externally.

Figure 14:
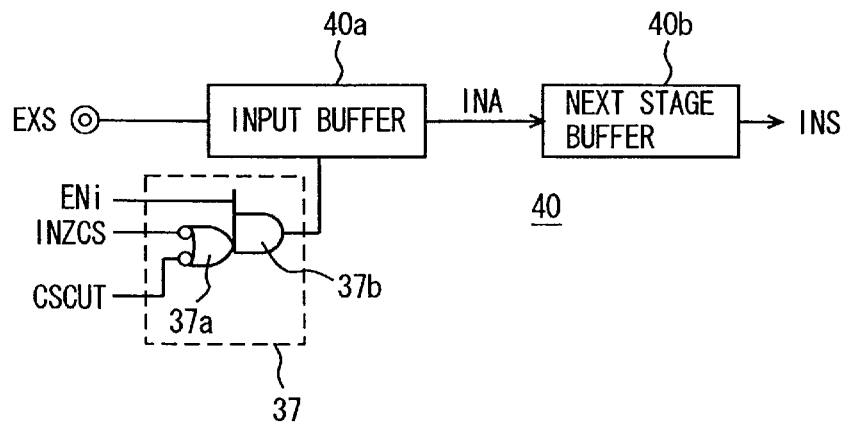
FIG. 14 is a block diagram showing an example of the combined configuration of a logic gate and buffer circuit shown in FIG. 13.

FIG. 14 is a block diagram showing an example of the configuration of buffer circuit 40 and logic gate 37 shown in FIG. 13. In FIG. 14, buffer circuit 40 includes: an input buffer 40a connected to an external pin terminal (a signal input node) and receiving external signal EXS to generate an internal signal INA when operates; and a next stage buffer 40b buffering internal signal INA outputted by input buffer 40a to generate internal signal INS. Input buffer 40a is coupled to the external pin terminal (the signal input node) and generates an internal signal INSA according to external signal EXS at high speed when operates. Therefore, where a current drive capability of input buffer 40a is larger than that of next state buffer 40b, a current consumption is reduced by cutting off a current flowing path of first stage input buffer 40a according to an output signal of logic gate 37.

Logic gate 37 is constituted of a NAND/AND composite gate and includes equivalently a NAND gate 37a receiving internal chip select signal INCS and CS cut mode instructing signal CSCUT, and an AND gate 37b receiving an output signal of NAND gate 37a and state control signal ENi. An output of logic gate 37 is applied instead of state control signal ENi shown in FIGS. 3 to 5. Thereby, a current flowing path of the first stage input buffer 40a of the input circuit 40 is cut off to reduce a current consumption.

A current consumption in a non-access state is reduced by cutting off a current path of first stage input buffer 40a when internal chip select signal INS is inactive in the CS cut mode as shown in FIG. 14.

When CS cut mode is not set, CS cut mode instructing signal CSCUT is at L level while an output signal of NAMD gate 37a goes to H level. Therefore, an output signal of logic gate 37 is set according to state control signal ENi. When state control signal ENi is in an active state, input buffer 40a operates normally. On the other hand, when state control signal ENi is in an inactive state, an operating current flowing path of input buffer 40a is cut off to maintain its inactive state all the times.

It should be noted that where input buffer 40a shown in FIG. 14 is a NOR type input buffer as shown in FIG. 5, a PMOS transistor as a current source enters an off state, an operating current flowing path is cut off, and the output node thereof is fixed at L level by a discharging N channel MOS transistor. Therefore, in the configuration of the NOR type buffer as well, a current path through which an operating current flows from a power supply node to a ground node is cut off.

[Modification]

Figure 15:
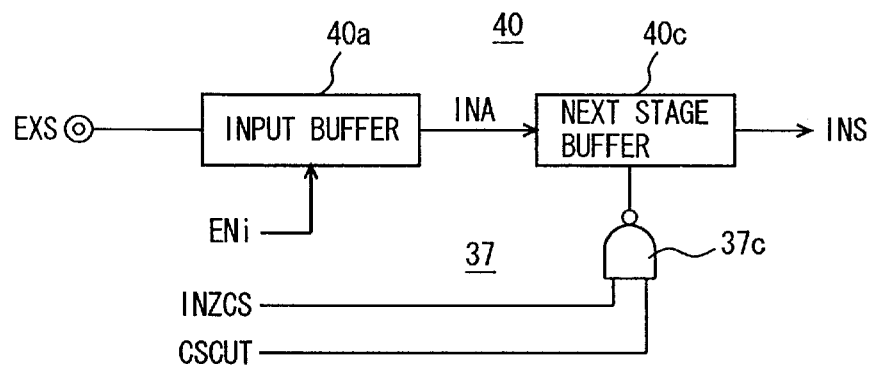
FIG. 15 is a block diagram showing an example modification of the logic gate and buffer circuit combined show in FIG. 13.

FIG. 15 is a block diagram showing an example of the modification of logic gate 37 and buffer circuit 40 shown in FIG. 13. In FIG. 15, buffer circuit 40 includes an input buffer 40a selectively set to an operable state according to state control signal ENi and generating internal signal INA according to external signal EXS when set in an operable state; and a next stage buffer 40c for buffering internal signal INA outputted by input buffer 40a to generate internal signal INS. Next stage buffer 40c may have a delay function for adjusting an internal timing.

Logic gate 37 includes a NAND gate 37c receiving internal chip set select signal INZCS and CS cut mode instructing signal CSCUT to give an output signal to next stage buffer 40c.

Logic gate 37 applies state control signal ENi to input buffer 40a without performing logical operation thereon, but performs an logical operation on internal chip select signal INZCS and CS cut mode instructing signal CSCUT to apply the operational result to next stage buffer 40c. Input buffer 40a has one of the configurations of FIGS. 3 to 5.

Next stage buffer 40c is not required to perform interface matching and buffers internal signal INA applied from input buffer 40a to provide a prescribed delay time to internal signal INA for timing adjustment between internal signals. Next stage buffer 40c generally has the configuration of a CMOS inverter and has a current path thereof cut off when an output signal of NAND circuit 37c is at L level. Therefore, next stage buffer 40c has a configuration similar to the configuration shown in FIG. 3 and receives an output signal of NAND circuit 37c, instead of state control signal ENi.

When CS cut mode instructing signal CSCUT is at L level, a output signal of NAND circuit 37c goes to H level and next stage buffer 40c generates internal signal INS according to internal signal INA regardless of a state of internal chip select signal INZCS.

When CS cut mode instructing signal CSCUT is at H level, NAND circuit 37c operates as an inverter. When internal chip select signal INZCS goes to H level in this state, NAND circuit 37c outputs a signal at L level to cut off an operating current flowing path of next stage buffer 40c.

It should be noted that a configuration of next stage buffer 40c is only required to have its operating current path cut off. For example, a transistor for cutting off a current is provided between the power supply node and ground node and the operating current path is cut off according to an output signal of NAND circuit 37c by turning off the cutting off transistor.

Alternatively, such a configuration may be used for the next stage buffer that when an output signal of NAND circuit 37c goes to L level, an operating current flowing path is cut off and the internal signal INS is set to a prescribed voltage level (a power supply voltage level or a ground voltage level). It can be achieved by cutting off an operating current flowing path in next stage buffer 40c, and by providing a resetting transistor for setting internal signal INS to H level or L level.

Where next stage buffer 40c is required to drive a signal line with large load at a high speed, a current drive capability thereof is increased. Therefore, a current consumption in the standby can be further reduced by cutting off an operating current flowing path of next stage buffer 40c.

[Second Modification]

Figure 16:
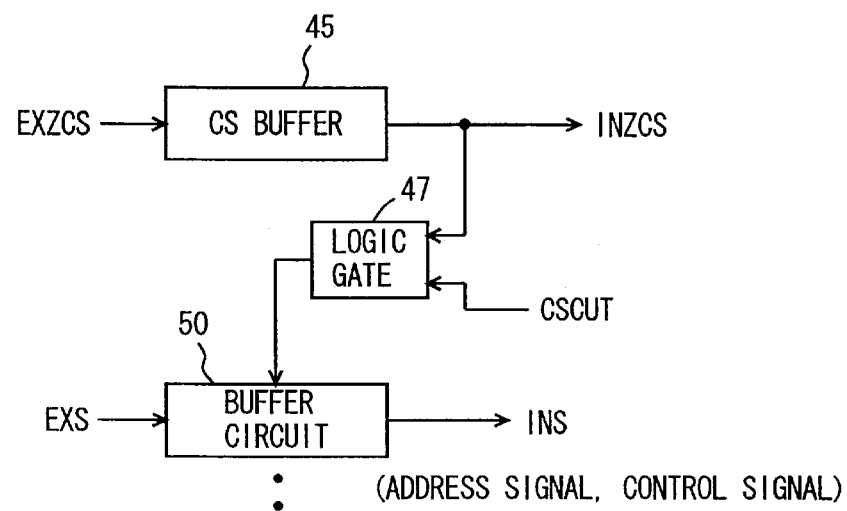
FIG. 16 is a block diagram schematically showing another example of the modification of the third embodiment of the present invention.

FIG. 16 is a block diagram schematically showing a configuration of an input buffer circuit according to a second modification of the third embodiment of the present invention. In FIG. 16, a CS buffer 45 and a buffer circuit 50 are not provided with state control signal EN. That is, CS buffer 45 and buffer circuit 50 have respective configurations determined fixedly in advance. Internal chip select signal INZCS from CS buffer 45 and CS cut mode instructing signal CSCUT are applied to logic gate 47. Logic gate 47 specifies an operating state of buffer circuit 50 according to internal chip select signal INZCS and CS cut mode instructing signal CSCUT. In buffer circuit 50, an operating current flowing path of first stage buffer or next stage buffer, as shown in FIGS. 14 and 15, is selectively cut off according to an output signal of logic circuit 47 when internal chip select signal INZCS is at H level of an inactive state. Logic gate 47 has a configuration similar to that of NAND circuit 37c shown in FIG. 15.

Even for a configuration in which the type of an input buffer is fixedly determined in advance without arranging input buffers of plural types, by setting CS cut mode instructing signal CSCUT in a register circuit of a mode register, a consumed current can be reduced in an operating mode requiring a low consumed current such, as a waiting time in a low current consumption application such as portable equipment.

With a configuration in which use or non-use of the CS cut mode is set in the mode register, a semiconductor memory device with the CS cut mode and a semiconductor memory device without the CS cut mode can be implemented with the same internal configuration. There is no need to fabricate different semiconductor devices according to applications, thereby enabling accommodation for plural kinds of applications with the same chip configuration.

As described above, according to the third embodiment of the present invention, a configuration is employed in which the CS cut mode is selectively set using a mode register, thereby enabling implementation of a semiconductor memory device adaptable to either of a low current consumption application and a standard current consumption application with the same chip configuration. Furthermore, where the CS cut mode is used, a consumed current in a non-selected state can be reduced.

[Fourth Embodiment]

Figure 17:
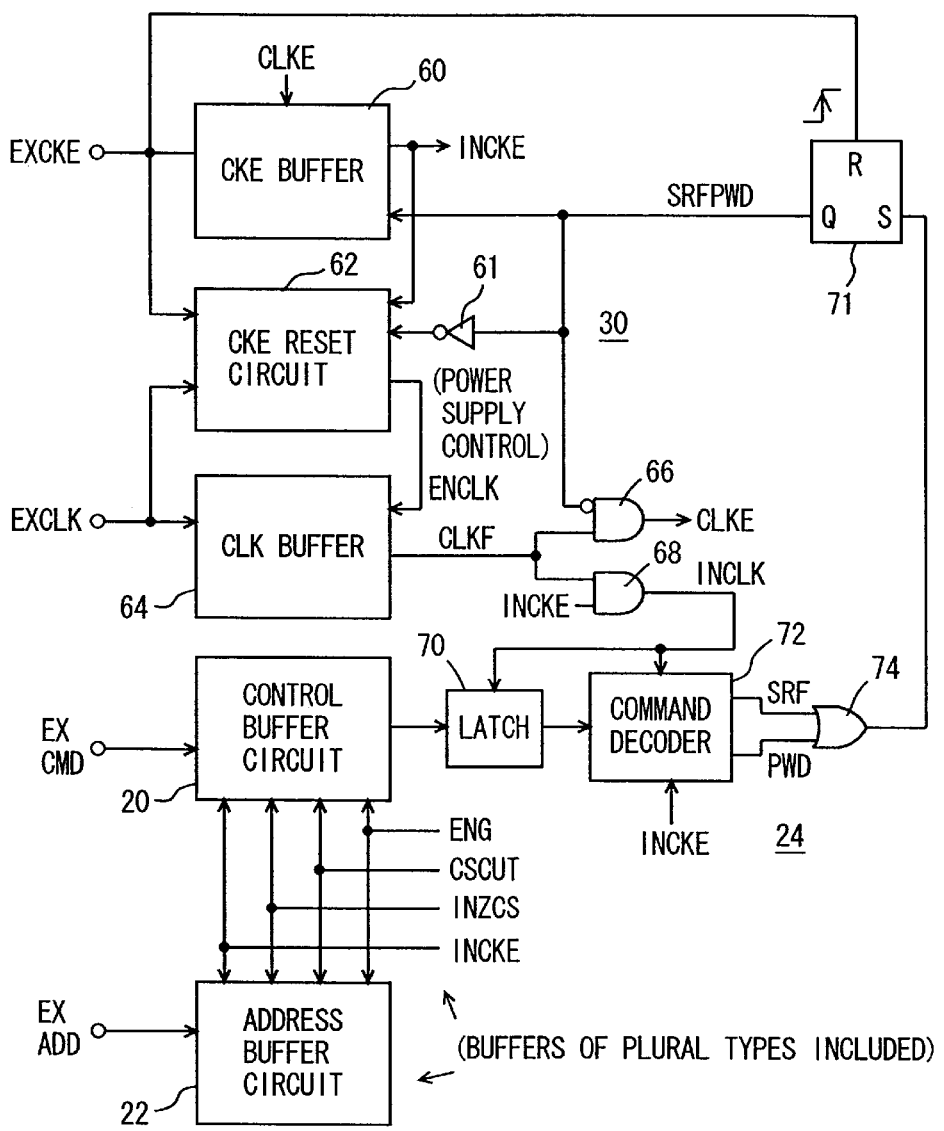
FIG. 17 is a block diagram schematically showing a configuration of a main portion of a semiconductor memory device according to a fourth embodiment of the present invention.

FIG. 17 is a block diagram showing internal clock generation circuit 30 of a semiconductor memory device according to a fourth embodiment of the present invention. In FIG. 17, internal clock generation circuit 30 includes: a CKE buffer 60 receiving external clock enable signal EXCKE to generate internal clock enable signal INCKE according to clock control signal CLKE and low power mode instructing signal SRFPWD; a CLK buffer 64 receiving external clock signal EXCLK to generate internal buffer clock signal CLKF; and a CKE reset circuit 62 selectively deactivating CLK buffer 64 according to internal clock enable signal INCKE and low power mode instructing signal SRFPWD in the low power mode.

When one of a self-refresh mode instructing signal SRF and a power down mode instructing signal PWD is activated, a latch circuit 71 is set and low power mode instructing signal SRFPMD is activated. Low power mode instructing signal SRFPWD outputted by latch circuit 71 is applied to CKE buffer 60. A complementary low power mode instructing signal ZSRFPWD is applied to CKE reset circuit 62 through inverter 61. Latch circuit 71 is deactivated when external clock enable signal EXTCKE rises. That is, low power mode instructing signal SRFPWD outputted by latch circuit 71 is used for controlling a buffer circuit at an input stage. When a low power mode exit instructing signal is applied, internal circuitry completes its low power mode operation. A clock generating operation of CLK buffer 64 is controlled according to clock activation signal ENCLK from CKE reset circuit 62.

CLK buffer 64 is a one-shot pulse generation circuit, and generates a one-shot pulse signal as buffered clock signal CKLF in response to external clock signal EXCLK. By generating a one-shot pulse signal internally, an internal clock signal with a prescribed pulse width is generated to stabilize an internal operation timing without an influence of variations in pulse width of external clock signal EXCLK.

CKE buffer 60 transfers external clock enable signal EXCKE according to clock control signal to generate internal clock enable signal INCKE. Specifically, CKE clock buffer 60 has a transfer gate and takes in external clock enable signal EXCKE in synchronization with a rise of clock control signal CLKE to output taken in external clock enable signal EXCKE in synchronization with a fall of clock control signal CLKE, as internal clock enable signal INCKE.

CKE reset circuit 62 drives clock activation signal ENCLK from an inactive state to an active state according to external clock enable signal EXCKE and external clock signal EXCLK when clock activation signal ENCLK is inactive (in the low power mode).

Internal clock generation circuit 30 further includes: a gate circuit 66 receiving buffer clock signal CLKF from CLK buffer 64 and low power mode instructing signal SRFPWD to generate clock control signal CLKE; and a gate circuit receiving buffer clock signal CLKF and internal clock enable signal INCKE. Gate circuit 66 fixes clock control signal CLKE at L level all the times when low power mode instructing signal SRFPWD is in an inactive state at H level. On the other hand, when low power mode instructing signal SRFPWD is at L level, gate circuit 66 generates clock control signal CLKE according to buffered clock signal CLKF from CLK buffer 64. Therefore, in the low power mode, clock control signal CLKE is in an inactive state, a transfer operation of CKE buffer 60 is ceased and CKE buffer 60 enters a latching state. Operation of CKE buffer 60 is ceased in the low power mode to reduce power consumption. In the low power mode, as described later, internal clock enable signal INCKE is fixed at L level according to external clock enable signal EXCKE.

Gate circuit 68 is an AND circuit and generates internal clock signal INCLK according to buffered clock signal CLKF when internal clock enable signal INCKE is at H level, while fixing internal clock signal INCLK at L level when internal clock enable signal INCKE is at L level.

Control circuit 24 shown in FIG. 9 includes: a latch circuit 70 for latching an internal control signal from control buffer circuit 20 in synchronization with internal clock signal INCLK; a command decoder 72 for decoding the internal control signal applied through latch circuit 70 according to internal clock signal INCLK; and OR circuit 74 generating a low power mode activation signal according to self-refresh mode instructing signal SRF from command decoder 72 and power down mode instructing signal PWD. An output signal of OR circuit 74 is used for controlling operation of the input buffer circuitry as described above.

Command decoder 72 performs a decoding operation according to internal clock signal INCLK when internal clock enable signal INCKE is in an active state, while being prohibited from performing a decoding operation when internal clock enable signal INCKE is an inactive state. In this case, a configuration may be employed in which a circuit at an input stage of command decoder 72 is driven to an inactive state and the current flowing path thereof is cut off.

Self-refresh mode instructing signal SRF is activated when a mode in which only data holding is performed internally is specified, and stored data in memory cells is refreshed internally at a prescribed period under control of a refresh control circuit not shown when self-refresh mode instructing signal SRF is activated.

Power down mode instructing signal PWD activates the operation mode of the semiconductor memory device into a low power consumption mode to ceases the supply of the power to a predetermined internal circuit. In the power down mode, no refresh operation is performed.

Power down mode instructing signal PWD is set where the standby state continues over a long period to reduce power consumption. Self-refresh mode instructing signal SRF is activated in the sleep mode or the like in which no access to the semiconductor memory device is made over a relative long period. When one of self-refresh mode instructing signal SRF and power down mode instructing signal PWD is activated, latch circuit 71 is set in response to an output signal of OR circuit 74 to activate low power mode instructing signal SRFPWD.

While configurations of a self-refresh control circuit and an internal power supply control circuit are not shown in FIG. 17, self-refresh mode instructing signal SRF and power down mode instructing signal PWD are applied to the self-refresh control circuit and the internal power supply control circuit, respectively. In the power down mode, a power supply voltage is supplied to circuits such as a command decoder and a clock input buffer. This is because an operating mode instructing signal provided externally should be monitored at all times. However, as detailed below, in the low power mode, power supply control is performed on control buffer circuit 20 and address buffer circuit 22 to cut off supply of the power supply voltage.

Control buffer circuit 20 and address buffer circuit 22 have configurations similar to the circuits shown in FIG. 9 and operating current paths thereof are cut off according to state control signal group ENG, CS cut mode instructing signal CSCUT and internal chip select signal INZCS.

It should be noted that although not clearly shown in FIG. 17, clock input buffers of plural types are provided in CLK buffer 64 and one clock input buffer is driven to an operable state according to state control signal group ENG. For power supply control on the clock buffer, there is used a result of a logical operation (AND) on clock activation signal ENCLK and state control signal ENi.

In the fourth embodiment, furthermore, when internal clock enable signal INCKE is in an inactive state, operating current flowing paths of control buffer circuit 20 and address buffer circuit 22 are cut off. A signal obtained by performing a logical product operation on internal clock enable signal INCKE and state control signal ENi is applied in the configurations shown in FIGS. 14 and 15 in place of state control signal ENi. The configuration to cut off an operating current flowing path of an input buffer when internal clock enable signal INCKE is in an inactive state may also be provided in a CS buffer generating an internal chip enable signal INZCS.

Internal clock enable signal INCKE is deactivated when low power mode instructing signal SRFPWD is activated to cut off operating current paths of control buffer circuit 20 and address buffer circuit 22, thereby enabling more reduction in consumed current in the low power consumption mode. Furthermore, a operating current path of an internal circuit of CLK buffer 64 is deactivated by CKE reset circuit 62 according to clock activation signal ENCLK when internal clock enable signal INCKE is inactive. Current consumption in CLK buffer 64 transmitting the internal clock signal to various internal circuits with a relative large drive capability can be reduced and current consumption as a whole can be reduced more. Especially, since CLK buffer 64 is required to generate buffer clock signal CLKF with a steep pulse waveform according to a high speed clock signal, a driving current therein is a relatively large. Therefore, a current consumption can be reduced effectively by deactivating CLK buffer 64 to cut off an operating current path thereof in the low power mode.

Figure 18:
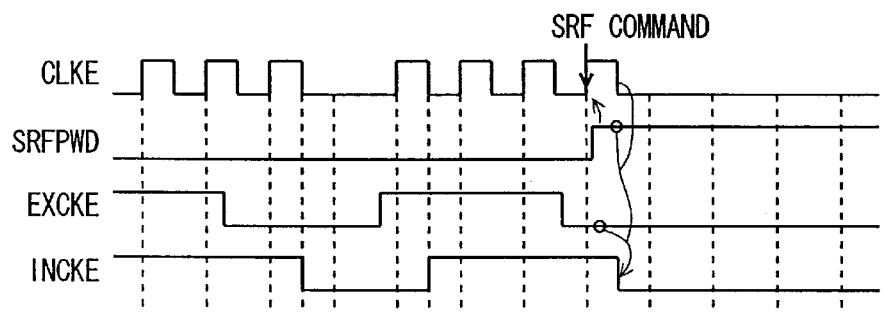
FIG. 18 is a timing chart schematically representing operation of a CKE buffer shown in FIG. 17.

FIG. 18 is a timing chart representing an operation of CKE buffer 60 shown in FIG. 17 schematically. Description will be given of operation of CKE buffer 60 shown in FIG. 17 below with reference to the timing chart shown in FIG. 18. In FIG. 18, CKE buffer 60 transfers external clock enable signal EXCKE according to clock control signal CLKE from gate circuit 66. When external clock enable signal EXCKE falls to L level, internal clock enable signal INCKE falls to L level in the next clock cycle.

In CKE buffer 60, when clock control signal CLKE goes to H level, a latch/transfer gate at the first stage enters a latch state, while a latch/transfer gate at the output stage outputs the latched signal when clock control signal CLKE goes to L level. For example, CKE buffer 60 includes: a first stage transfer gate or clocked buffer rendered non-conductive in response to a rise of clock control signal CLKE; a latch circuit latching an output signal of the first transfer gate or clocked buffer; and an output stage transfer gate or a clocked buffer transferring the latched signal of the latch circuit in synchronization with a fall of clock control signal CLKE.

Therefore, as shown in FIG. 18, even if external clock enable signal EXCKE falls to L level when clock control signal CLKE is at H level, CKE buffer 60 is in a latch state and in this cycle, internal clock enable signal INCKE maintains the H level.

In the next cycle as well, if the external clock enable signal EXCKE is at L level, CKE buffer 60 transfers external clock enable signal EXCKE at L level according to clock control signal CLKE and therefore, internal clock enable signal INCKE falls to L level in synchronization with a fall of clock control signal CLKE.

When external clock enable signal EXCKE is set at H level prior to a rise of clock control signal CLKE, CKE buffer 60 transfers external clock enable signal EXCKE according to clock control signal CLKE to generate internal clock enable signal INCKE. Therefore, internal clock enable signal INCKE rises to H level in this clock cycle.

External clock enable signal EXCKE is a signal asynchronous with external clock signal EXCLK. Clock control signal CLKE is a signal synchronous with external clock signal EXCLK as shown in FIG. 17. Therefore, when the self-refresh mode is specified, external clock enable signal EXCKE is required to fall from H level to L level in a previous clock cycle. In application of a self-refresh command (a SRF command), therefore, external clock enable signal EXCKE is at L level upon a rise of clock control signal CLKE and internal clock enable signal INCKE goes to L level in synchronization with a fall of clock control signal CLKE in this clock cycle.

Therefore, where a self-refresh command and external clock enable signal EXCKE are applied fully meeting a set-up time and a hold time, internal clock enable signal INCKE goes to L level in a clock cycle in which the self-refresh command is applied, to drive buffer circuits 20 and 22 shown in FIG. 17 to an inactive state. Acceptance of a command after application of the self-refresh command is ceased till internal clock enable signal INCKE is set to H level. Setting of internal clock enable signal INCKE upon completion of the low power mode is performed by resetting latch circuit 71 according to external clock enable signal EXCKE to deactivate low power mode instructing signal SRFPWD as shown in FIG. 17.

When internal clock enable signal INCKE is activated, buffer circuits 20 and 22 operate to take in external signals and generate internal signals. Hence, an internal circuit can be restored to a normal state through application of low power mode completion instructing command.

Figure 19A:
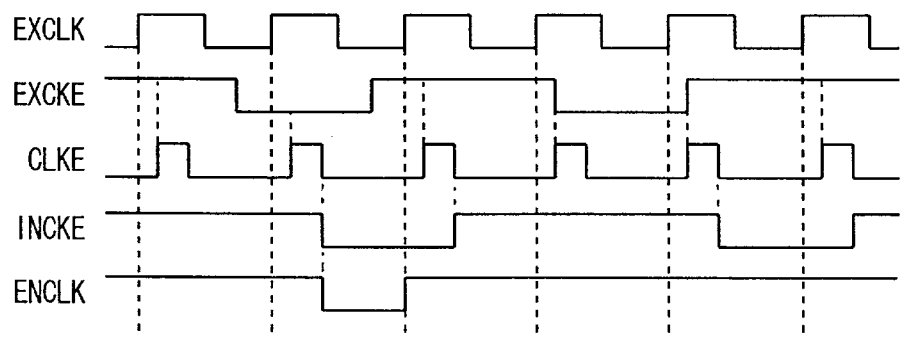
FIGS. 19A and 19B are timing charts representing operations of the CKE buffer shown in FIG. 17.

FIG. 19A is a timing chart showing a relationship in timing between external clock signal EXCLK and external clock enable signal EXCKE specifically. As shown in FIG. 19A, clock control signal CLKE is generated as a one-shot pulse signal in synchronization with external clock signal EXCLK. Internal clock enable signal INCKE is generated in synchronization with clock control signal CLKE, and clock activation signal ENCLK is generated from CKE reset circuit 62 according to internal clock enable signal INCKE, external clock enable signal EXCKE and external lock signal EXCLK.

In the normal operation mode, or when low power mode instructing signal SRFPWD is at L level, clock control signal CLKE is generated according to external clock signal EXCLK. When internal clock enable signal INCKE falls to L level according to a fall of external clock enable signal EXCKE, clock control signal ENCKE falls to L level responsively. However, when external clock enable signal EXCKE is raised to H level prior to a rise of the next external clock signal EXCLK, clock activation signal ENCLK rises to H level in response to a rise of the next external clock signal EXCLK, clock control signal CLKE is generated in this cycle to allow an external signal to be taken in.

Therefore, even if internal clock enable signal INCKE falls to L level, clock activation signal ENCLK is restored to H level in response to a rise of external clock signal EXCLKE and therefore, CLK buffer circuit 64 executes an operation for taking in an external clock signal even if external clock enable signal EXCKE is lowered to L level for one clock cycle. However, since internal clock signal INCLK is generated according to buffered clock enable signal CLKF when internal clock enable signal INCKE is at H level, no internal clock signal INCLK is generated in a cycle in which internal clock enable signal CLKE goes to L level.

When external clock enable signal EXCKE is set to L level while external clock signal EXCLK is at H level, internal clock signal INCKE falls to L level in the next cycle. However, even if internal clock enable signal INCKE goes to L level, external clock enable signal EXCKE is at H level at that time and clock activation signal ENCLK maintains the H level. Hence, where external clock enable signal EXCKE is set at L level for a period of one clock cycle, clock control signal CKLE is generated in synchronization with external clock signal EXCLK all the times.

However, in this case as well, when internal clock enable signal INCKE goes to L level, no internal clock signal INCLK is generated. In other words, internal clock enable signal INCKE is generated according to external clock enable signal EXCKE in synchronization with clock control signal CLKE. Therefore, when internal clock enable signal INCKE falls to L level, internal clock signal INCLK is not generated in the next clock cycle, to cease an internal operation and an internal circuit maintains the state in the preceding clock cycle.

As described above, a cycle in which internal clock enable signal INCKE is deactivated is different according to a set-up time/a hold time of external clock enable signal EXCKE for clock control signal CLKE or external clock signal EXCLK. For this reason, in application of a self-refresh command, it is required to lower external clock enable signal EXCKE from H level to L level in a preceding cycle. Therefore, in the application of the self-refresh command, internal clock enable signal INCKE is deactivated in response to a fall of clock control signal CLKE in a cycle in which the self-refresh command is applied. In the cycle in which the self-refresh command is applied, internal clock signal INCLK has been generated and an internal circuit can operate according to the self-refresh command correctly.

Figure 19B:
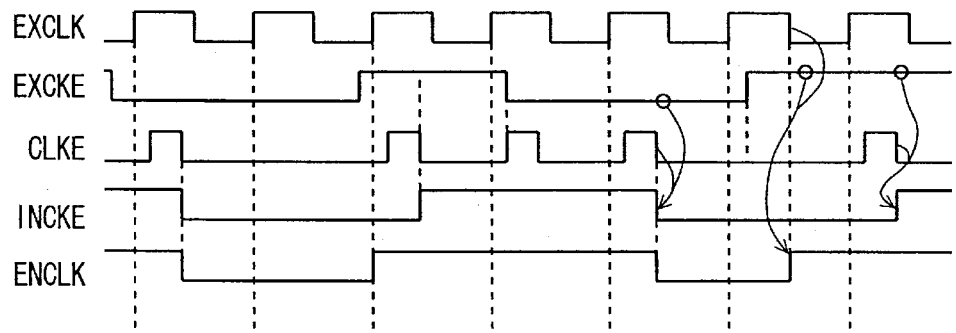

Now, description will be given of operation for ceasing generation of clock control signal CLKE according to external clock enable signal EXCKE referring to FIG. 19B. First, external clock enable signal EXCKE is lowered to L level prior to a rise of external clock signal EXCLK. Internal clock enable signal INCKE falls to L level in response to a fall of clock control signal CLKE. Since external clock enable signal EXCKE and internal clock enable signal INCKE are at L level, clock activation signal ENCLK falls to L level. If external clock enable signal EXCKE is maintained at L level in the next cycle as well, clock activation signal ENCLK maintains L level, generation of clock control signal INKE is ceased and internal clock enable signal INCKE maintains L level in the same next cycle as well.

If external clock enable signal EXCKE is raised to H level prior to a rise of external clock signal EXCLK, clock activation signal ENCLK rises to H level in response to a rise of external clock signal EXCLK. In the next clock cycle, clock control signal CLKE is generated and internal clock enable signal INCKE rises to H level in response to a fall of clock control signal CLKE.

Therefore, if external clock enable signal EXCKE is maintained at L level for a 2 clock cycle period, generation of clock control signal CLKE can be ceased in the second clock cycle from a fall to L level of external clock enable signal EXCKE. Therefore, generation of internal clock signal INCLK can be ceased in the second clock cycle according to internal clock enable signal INCKE.

If external clock enable signal EXCKE falls to L level when external clock signal EXCLK is at H level, clock control signal CLKE is generated in this cycle, and internal clock enable signal INCKE and clock activation signal ENCLK are both at H level.

In the next clock cycle, if external clock enable signal EXCKE is maintained at L level, internal clock enable signal INCKE and clock activation signal ENCLK fall to L level in response to a fall of clock control signal CKLE in the same next cycle. Specifically, when external clock signal EXCLK is generated and clock control signal CLKE is generated, no state of an internal signal changes if external clock enable signal EXCKE has no sufficient hold time relative to clock control signal CLKE, when clock control signal CLKE is generated.

In this clock cycle, the clock input buffer, therefore, takes in the external clock signal to generate the buffered clock signal CLKF. Furthermore, internal clock signal INCLK is likewise generated.

If external clock enable signal EXCKE rises to H level when external clock signal EXCLK is at H level, clock activation signal ENCLK rises to H level in response to a rise of external clock signal EXCLK. Therefore, in this cycle, clock activation signal ENCLK is at L level and clock control signal CLK is not generated. Therefore, CLK buffer 64 ceases its operation.

In the next cycle, clock activation signal ENCLK is at H level, clock control signal CLKE is generated according to buffer clock signal CLKF from CLK buffer 64 and internal clock enable signal INCKE is raised to H level in response to a fall of clock control signal CLKE by CKE buffer 60.

In other words, if external clock enable signal EXCKE is held at L level for a 2 clock cycle period, it is possible to internally set clock control signal CLKE to L level for prohibiting take-in of external clock signal EXCLK and to cease generation of internal clock signal INCLK.

Therefore, generation of internal clock enable signal INCKE can be ceased according to clock activation signal ENCLK in the third clock cycle after external clock enable signal EXCKE is lowered to L level regardless of a relationship in timing between external clock enable signal ENCKE and external clock signal EXCLK.

Hence, in order to deactivate internal clock enable signal INCKE, external clock enable signal EXCKE must be held at L level for a 2 clock cycle period. Therefore, in setting a state of internal clock enable signal INCKE according to external clock signal EXCLK, if external clock enable signal EXCKE is held for a three clock cycle period at L level, in the third clock cycle et seq., the internal clock enable signal INCKE attains the state corresponding to a state of external clock enable signal EXCKE.

It should be noted that when internal clock enable signal INCKE falls to L level, generation of internal clock signal INCLK is ceased in the next cycle according to internal clock enable signal INCKE.

Therefore, if external clock enable signal EXCKE is held at L level for a period of a prescribed number of clock cycles, internal clock enable signal INCKE is fixed at L level to cut off current paths of control buffer circuit 20 and address buffer circuit 22 shown in FIG. 17, and the internal circuitry ceases the operation or kept in a pending state. In a period in which no new operation is performed and it is not required to take in an external signal, the buffers taking in external signals have the power supply cut off, to reduce the power consumption or the current consumption in a normal mode of operation as well.

Figure 20:
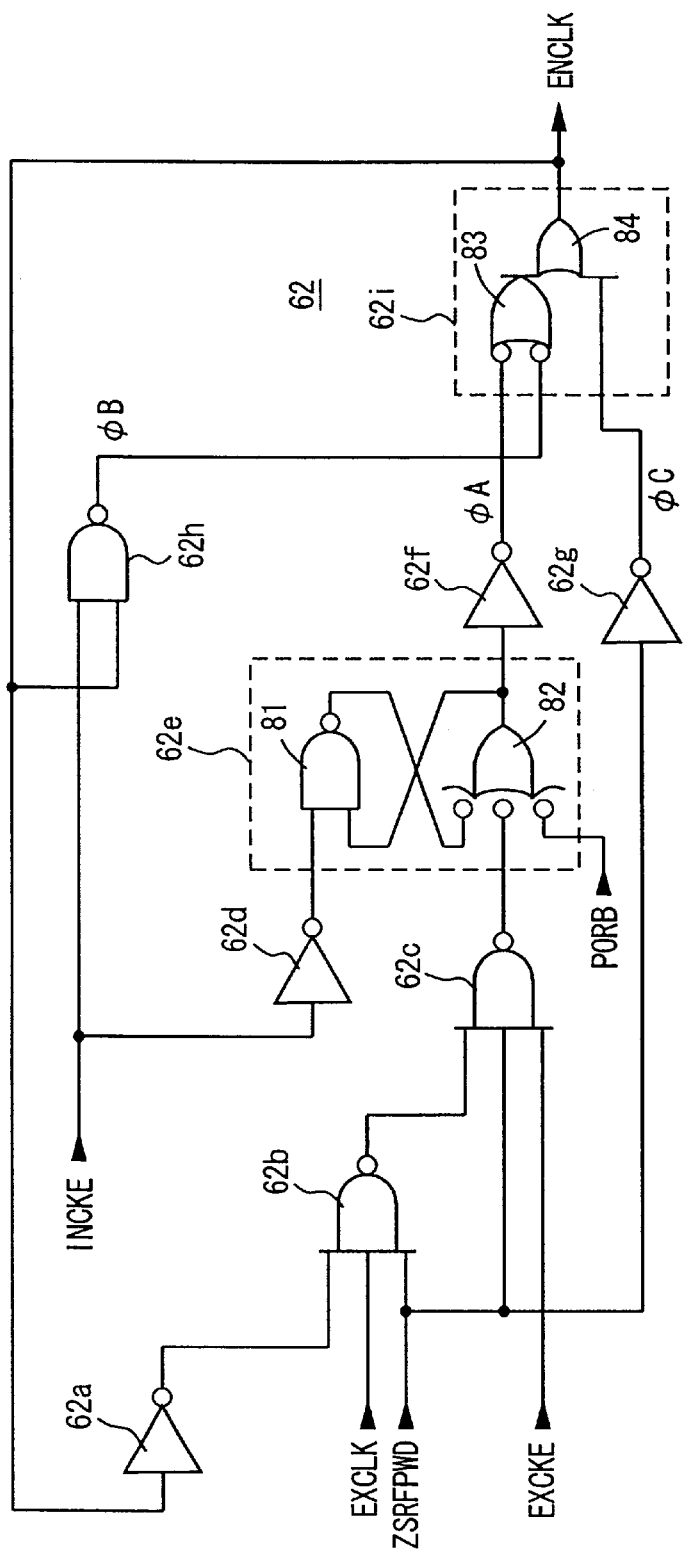
FIG. 20 is a diagram showing an example of the configuration of a CKE reset circuit shown in FIG. 17.

FIG. 20 is a diagram showing an example of the configuration of CKE reset circuit 62 shown in FIG. 17. In FIG. 20, CKE reset circuit 62 includes: an inverter 62a receiving clock activation signal ENCLK; a NAND circuit 62b receiving an output signal of inverter 62a, external clock signal EXCLK and complementary low power mode instructing signal ZSRFPWD; a NAND circuit 62c receiving an output signal of NAND circuit 62b, complementary low power mode instructing signal ZSRFPWD and external clock enable signal EXCKE; an inverter 62d receiving internal clock enable signal INCKE; a set/reset flip-flop 62e reset in response to a fall of an output signal of inverter 62d, and set in response to an output signal of NAND circuit 62c or a power-on reset signal PORB; an inverter 62f receiving an output signal of set/reset flip-flop 62e; an inverter 62g receiving complementary low power mode instructing signal ZSRFPWD; a NAND circuit 62h receiving clock activation circuit ENCLK and internal clock enable signal INCKE; and a composite gate 62i generating clock activation signal ENCLK according to an output signal $\phi$C of inverter 62g, an output signal $\phi$A of inverter 62f and an output signal $\phi$B of NAND circuit 62h.

Flip-flop 62e includes a NAND gate 81 receiving an output signal of inverter 62d at a first input thereof, and a 3-input NAND gate 82c receiving an output signal of NAND gate 81, an output signal of NAND circuit 62c and power-on reset signal PORB. An output signal of NAND gate 82 is applied to inverter 62f.

Composite gate 62i includes, equivalently, a NAND gate 83 receiving output signal $\phi$A of inverter 62f and output signal $\phi$B of NAND circuit 62h, and a gate 84 receiving an output signal of NAND gate 83 and output signal $\phi$C of inverter 62g to generate clock activation signal ENCLK. Gate 84 outputs a signal at H level when output signal $\phi$C of inverter 62g is at H level and an output signal of NAND gate 83 is at H level. Clock activation signal ENCLK is outputted from gate 84.

In the configuration of CKE reset circuit 62 shown in FIG. 20, in the normal operation mode, or when low power mode instructing signal SRFPWD is at L level and complementary low power mode instructing signal ZSRFPWD is at H level, output signal $\phi$C of inverter 62g is at L level, gate 84 operates as a buffer and clock activation signal ENCLK changes according to an output signal of the NAND circuit. In the normal operation mode, CLK buffer 64 has its operating current path selectively formed according to external clock enable signal EXCKE, to generate buffered clock signal CLKF according to external cock signal EXCLK when operates (see clock control signal CLKE in FIG. 18 and FIGS. 19A and 19B).

When low power mode instructing signal SRFPWD turns H level to specify the low power mode, complementary low power mode instructing signal ZSRFPWD turns L level. Responsively, output signal $\phi$C of inverter 62g goes to H level, clock activation signal ENCLK goes to L level, generation of internal clock enable signal INCKE and internal clock signal INCLK is ceased and operation of the buffer circuit is ceased. Thereby, a current consumption in the low power mode is reduced.

When external clock enable signal EXCKE is driven to H level, clock activation signal ENCLK, which has been in an inactive state, is again driven to H level. In the low power mode, by releasing a current cut-off state of a signal input circuit using external clock enable signal EXCKE, an input buffer circuit thereafter operates to accept a command for releasing the low power mode, to allow the device to restore the normal operation mode. Now, description will be given of operation of CKE reset circuit 62 with reference to the timing charts shown in FIGS. 21 and 22.

Figure 21:
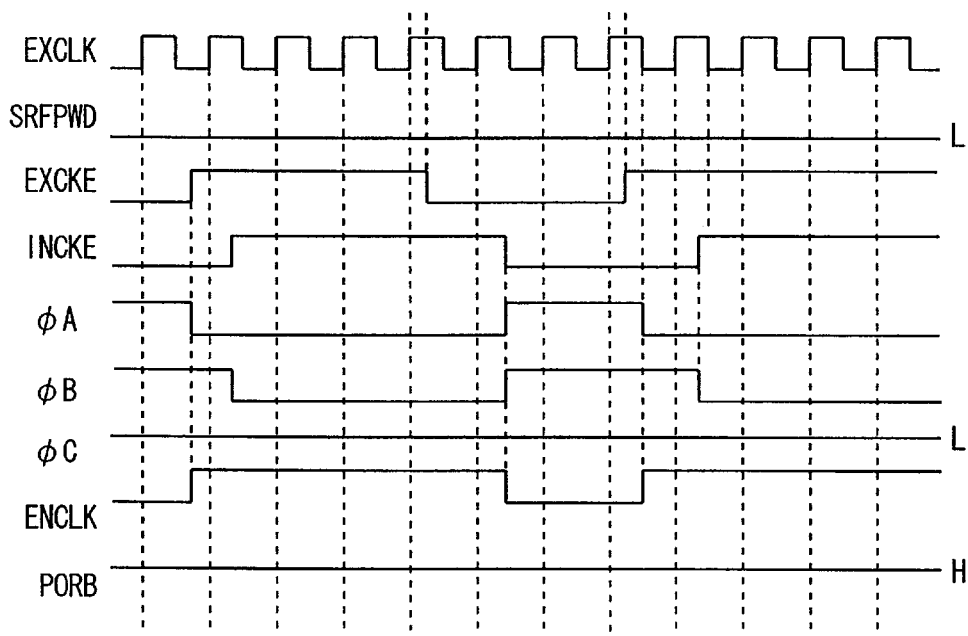
FIG. 21 is a timing chart representing an operation of a CKE reset circuit shown in FIG. 20 in an ordinary operation mode.

First, description will be given of operation in the normal operation mode, referring to FIG. 21. Power-on reset signal PORB is at L level when power is up and an output signal of NAND gate 82 is initialized to H level. In the normal operation mode, low power mode instructing signal ZSRF-PWD is at H level and voltage levels of output signals of NAND circuits 62b and 62c are determined according to external clock signal EXCLK and external clock enable signal EXCKE. Output signal $\phi$C of inverter 62g is fixed at L level.

When a power supply voltage is stabilized, power-on reset signal PORB is at H level. If external clock enable signal EXCKE goes to H level before external clock signal EXCLK attains H level, an output signal of NAND gate 62c attains L level, an output signal of NAND gate 82 attains H level, output signal $\phi$A of inverter 62f attains L level, and clock activation signal ENCLK responsively attains H level.

Then, When internal clock enable signal INCKE goes to H level according to external clock enable signal EXCKE, output signal $\phi$B of NAND circuit 62h goes to L level.

If external clock enable signal EXCKE falls to Level when external clock signal EXCLK is at H level, an output signal of NAND circuit 62c is at H level and no change occurs in the state of flip-flop 62e. In this clock cycle, since internal clock enable signal INCKE maintains the H level, clock activation signal ENCLK maintains the L level.

In the next cycle, if external clock enable signal EXCKE is still maintained at L level, internal clock enable signal INCKE falls to L level and output signal $\phi$B of NAND circuit 62h rises to H level. An output signal of inverter 62d goes to H level in response to a fall of internal clock enable signal INCKE, NAND gate 81 receives an H level signals at both inputs and outputs a signal at H level. Responsively, an output signal of NAND gate 82 goes to L level. Output signal $\phi$A of inverter 62f rises to H level in response to a fall of an output signal of NAND gate 82. Therefore, input signals to NAND gate 83 both go to H level to fall clock activation signal ENCLK to L level.

Where external clock enable signal EXCKE goes to H level when external clock signal EXCLK is at H level, if external clock signal EXCLK falls to L level, an output signal of NAND gate 62c goes to L level, an output signal of NAMD gate 82 goes to H level and in response, output signal $\phi$A of inverter 62f goes to L level. Therefore, an output signal of NAND gate 83 goes to H level and clock activation signal ENCLK goes to H level.

In the next cycle, internal clock enable signal INCKE rises to H level and output signal $\phi$B of NAND gate 62h goes to L level. Through such an operational procedure, operations shown in FIGS. 19A and 19B can be achieved.

When power is up, an output signal of NAND gate 82 is set at H level by power-on reset signal PORB, responsively, output signal $\phi$A of inverter 62f attains L level and clock activation signal ENCLK goes to H level. Therefore, when internal clock enable signal INCKE goes to H level, output signal $\phi$B of NAND circuit 62h goes to L level. In composite gate 62i, an output signal of NAND gate 83 is at H level, and clock activation signal ENCLK maintains the H level, even if flip-flop 62e is set and output signal $\phi$A of inverter 62f rises.

Therefore, in the normal operation mode, clock activation signal ENCLK can be selectively activated/deactivated according to external clock signal EXCLK and external clock enable signal EXCKE.

When internal clock enable signal INCKE is deactivated according to external clock enable signal EXCKE, control buffer circuit 20 and address buffer circuit 22 have their operation current flowing paths cut off and are deactivated. In this state, only an internal operation is merely maintained and no problem arises even if the circuits 20 and 22 are deactivated.

Figure 22:
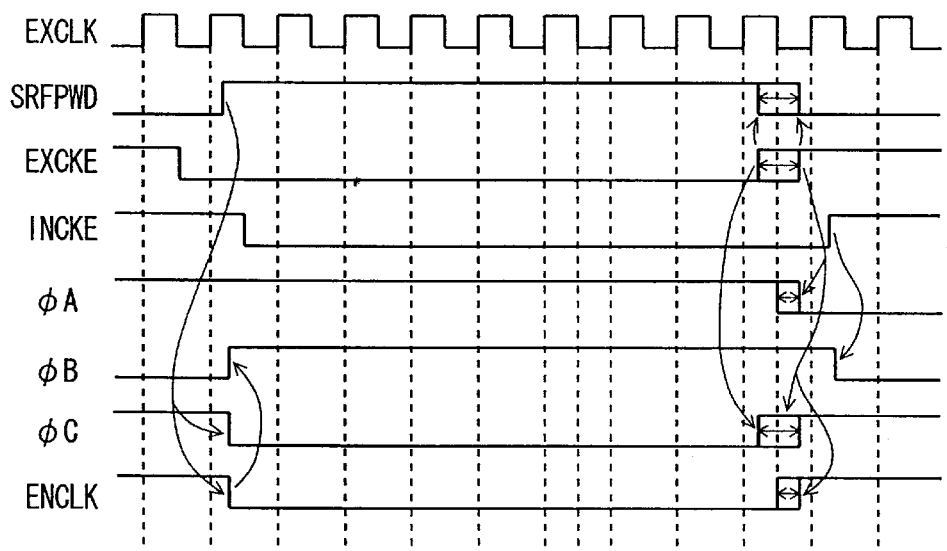
FIG. 22 is a timing chart representing an operation of the CKE reset circuit shown in FIG. 20 in a low power mode.

Now, description will be given of operation in the low power mode, referring to FIG. 22. In the low power mode, complementary low power mode instructing signal ZSRFPWD turns L level from H level. In transition to the low power mode, since clock activation signal ENCLK is at H level, an output signal of inverter 62a is at L level and an output signal of AND circuit 62b is at H level.

Therefore, when low power mode instructing signal SRF-PWD rises to H level and complementary low power mode instructing signal ZSRFPWD falls to L level, clock activation signal ENCLK is driven to L level by composite gate 62i. In the low power mode, external clock enable signal EXCKE is held at L level. Internal clock enable signal INCKE falls to L level in a cycle in which the low power mode instruction is applied.

In exiting from the low power mode such as the self-refresh mode, external clock enable signal EXCKE is raised to H level. This is because, as described previously, clock activation signal ENCLK is at L level and an input buffer is set in a non-conductive state to disable an external command to be accepted.

When external clock enable signal EXCKE rises to H level, latch circuit 71 shown in FIG. 17 is reset and low power mode instructing signal ZSRFPWD is reset to H level. When external clock signal EXCLK is at L level, an output signal NAND gate 62b is at H level, an output signal of NAND gate 62c goes to L level in response to a rise of external clock enable signal EXCKE, and set/reset flip-flop 62e is set to drive the output signal thereof to H level. Responsively, output signal φA of inverter 62f goes to L level, clock activation signal ENCLK goes to H level and a CLK buffer is activated to generate a buffered cock signal according to external clock signal EXCLK.

Where external clock enable signal EXCKE is set to H level when external clock signal EXCLK is at H level, if external clock signal EXCLK goes to L level, the output signal of NAND gate 62b goes to H level, flip-flop 62e is set and clock activation signal ENCLK goes to H level. Therefore, clock activation signal ENCLK is activated when external clock signal is at L level regardless of a timing relationship between external clock enable signal EXCKE and external clock signal EXCLK, and the buffered clock signal can be generated according to the next external clock signal EXCLK.

Internal clock enable signal INCKE is driven to H level in the next cycle. Output signal φB of NAND gate 62h falls from H level to L level according to activation of internal clock enable signal EXCKE. Therefore, when external clock enable signal EXCKE rises to H level, clock control signal CLKE is activated in the next clock cycle. In response, internal clock enable signal INCKE is activated and internal clock signal INCLK can be generated in the same next cycle et seq.

Therefore, after a period of 2 clock cycles elapses from a rise to H level of external clock enable signal EXCKE, an external command can be accepted to set an internal state and execute releasing from the self-refresh mode.

In the low power mode, by setting a CLK buffer, control buffer circuit 20 and address buffer circuit 22 each to a power supply cut-off state according to clock activation signal ENCLK and internal clock enable signal INCKE, a current consumption can be greatly reduced.

Furthermore, in exit from the low power mode, clock activation signal ENCLK is set in an active state when external clock signal EXCLK is at L level using external clock enable signal EXCKE. Therefore, a period of 2 clock cycles upon application of a low power mode exit command can be secured accurately, and timing control for exit from the low power mode can be facilitated.

Figure 23:
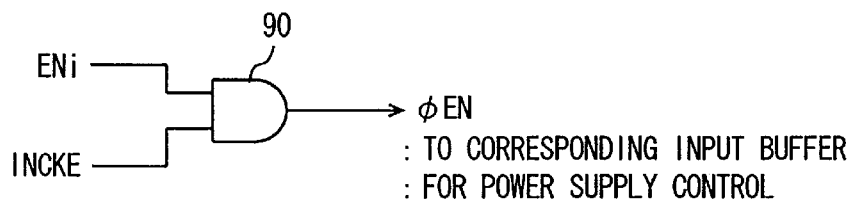
FIG. 23 is a diagram showing an example of configuration of a current control section of each of a control buffer circuit and an address buffer circuit shown in FIG. 17.

FIG. 23 is a diagram showing a configuration of a control section corresponding to one input buffer circuit. In FIG. 23, control signal φEN for a current source transistor of a corresponding input buffer circuit is generated by AND circuit 90 receiving state control signal ENi included in state control signal group ENG and internal clock enable signal INCKE. Thereby, even in a configuration including input buffers of types of plural kinds, a consumed current can be reduced in the low power consumption mode reliably by cutting off paths for operating current sources.

Control signal φEN shown in FIG. 23 is used in place of state control signal ENi shown in FIGS. 14 and 15.

[Modification]

Figure 24:
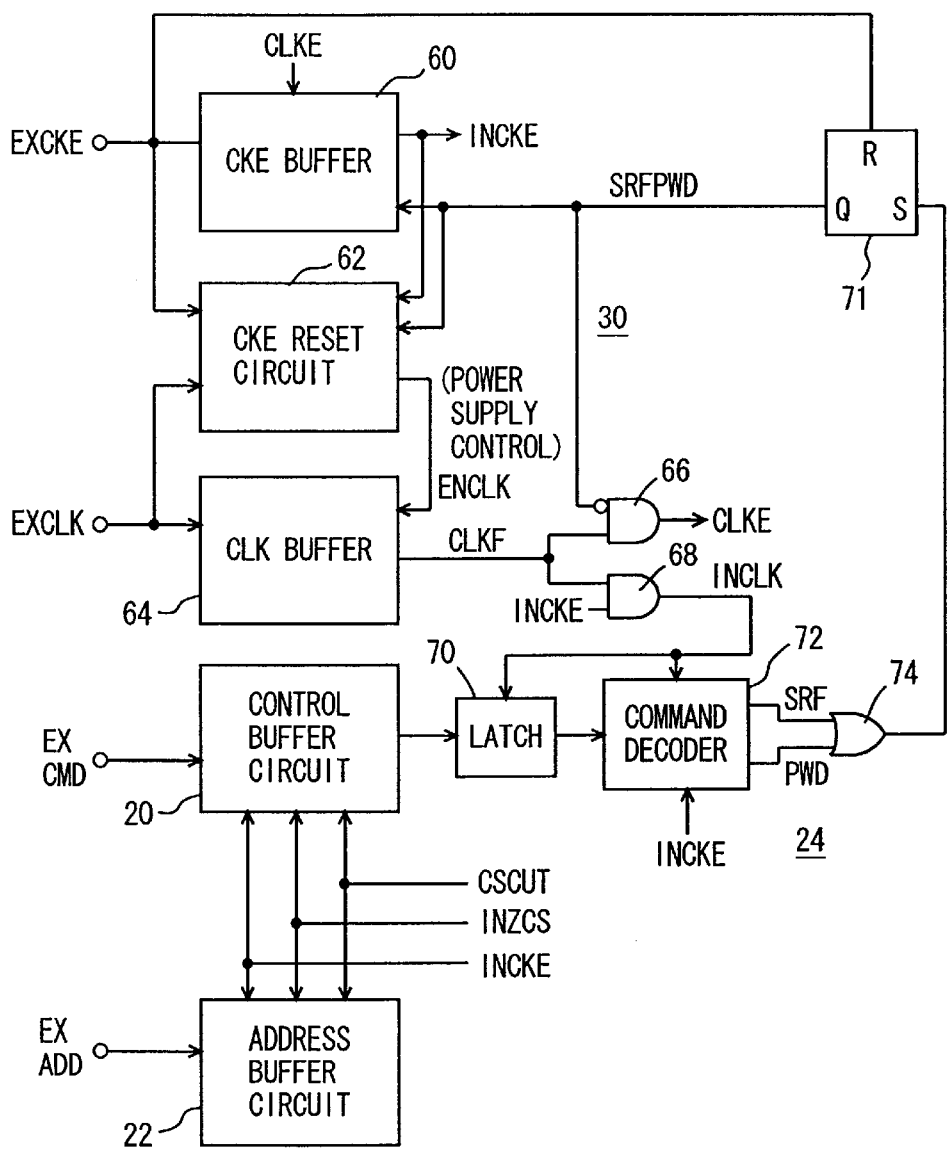
FIG. 24 is a block diagram schematically showing an example of a modification of the fourth embodiment of the present invention.

FIG. 24 is a block diagram schematically showing a configuration of a modification of the fourth embodiment of the present invention. In the configuration shown in FIG. 24, CS cut mode instructing signal CSCUT, internal chip enable signal INCKE and internal chip select signal INZCS are applied to control buffer circuit 20 and address buffer circuit 22, but the state control signal group is not applied to these buffer circuits. In other words, input buffers of one type are provided in control buffer circuit 20 and address buffer circuit 22 and operating current sources thereof are controlled according to CS cut mode instructing signal CSCUT, internal chip select signal INZCS and internal chip enable signal INCKE.

Hence, in a semiconductor memory device with input buffers of one kind, rather than input buffers of types of plural kinds, a configuration can be employed as well in which an operating current source is cut off according to internal clock enable signal INCKE, and in addition, CLK buffer 64 generating an internal (buffer) clock signal is reset. The other parts of the configuration are the same as those of the configuration shown in FIG. 17, the same reference numerals are attached to the same components and detailed description thereof is omitted.

As described above, according to the fourth embodiment of the present invention, in the low power consumption mode, when a predetermined condition is met, a current source of an input buffer circuit is cut off, thereby a consumed current can be reduced more in the low power consumption mode.

It should be noted that in the low power mode, if external clock enable signal EXCKE is held at L level for a period of 2 clock cycles, internal clock enable signal INCKE is deactivated. The number of clock cycles for which external clock enable signal EXCKE is held at L level may be 3 or more, or alternatively, a specific command may be used for cutting off of a current source.

As described above, according to the present invention, input buffers of types of plural kinds are provided in parallel to one signal input node and selectively used according to storage contents of a program circuit. Therefore, with a simple configuration, an input buffer of a desired type can be used with ease, thereby enabling reduction in turn around time and accordingly decrease in product cost.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a plurality of input buffers of different types or configurations from each other and coupled to a common internal node; and
   program circuitry for generating a signal setting one of said plurality of input buffers to an operable state, said plurality of input buffers driving the internal node according to a received signal when an input buffer is set to the operable state.

2. The semiconductor device according to claim 1, wherein said program circuitry comprises fuse elements that can be selectively blown off.

3. The semiconductor device according to claim 1, wherein
   said program circuitry comprises:
      a plurality of fuse circuits each including a fuse element selectively blown off and generating a signal corresponding to a blown off or conductive state of said fuse element; and
      a decode circuit for decoding the output signals of said plurality of fuse circuits and generating a signal for controlling operation enabled and disabled states of the input buffers.

4. The semiconductor device according to claim 1, wherein said program circuitry comprises a decode circuit for decoding voltage signals applied to a plurality of bonding pads set to respective prescribed voltage levels and generating a signal for controlling operation enabled and disabled states of the input buffers.

5. The semiconductor device according to claim 1, further comprising:
   a register circuit for storing a data signal specifying whether control on an input buffer set to an operable state among said plurality of input buffers by an operation activating signal is valid, said operation activating signal indicating that an external signal applied to an input node provided corresponding to said plurality of input buffers is a valid signal; and
   an activation control circuit for selectively activating said input buffer set to an operable state according to said operation activating signal and the stored data signal in said register circuit, said activation control circuit selectively activating said input buffer set to an operable state in accordance with said operation activating signal when the stored data signal indicating that the control on the input buffer set to an operable state by the activation control signal is valid, and rendering the plurality of input buffers operable in accordance with the signal programmed in said program circuitry when said stored signal in said register circuit indicates that control on said input buffer set to an operable state by said operation activating signal is invalid.

6. The semiconductor device according to claim 5, wherein said semiconductor device is a synchronous semiconductor memory device operating in accordance with a clock signal, and
   said operation activating signal is a chip select signal indicating that said semiconductor memory device is selected.

7. The semiconductor device according to claim 1, further comprising:
   a next stage buffer circuit for further buffering the signal on said internal node;
   a register circuit for storing a signal specifying whether control on said next stage buffer circuit by an operation activating signal is valid, said operation activating signal indicating that an external signal applied to a signal input node provided corresponding to said plurality of input buffers is a valid signal; and
   an activation control circuit for selectively activating said next stage buffer circuit in accordance with said operation activating signal, said signal stored in said register circuit, and the signal programmed in said program circuit, said activation control circuit selectively activating said next stage buffer according to said operation activating signal when said signal stored in said register circuit indicates that control on said next stage buffer by said operation activating signal is valid, and setting said next stage buffer to an operating state all the times when said stored data in said register circuit indicates that control on said next stage buffer circuit by said operation activating signal is invalid.

8. The semiconductor device according to claim 1, further comprising:
   a clock enable buffer for generating an internal clock enable signal according to an external clock enable signal;
   a clock activation circuit for activating a clock activation signal in response to said internal clock enable signal and said external clock enable signal; and
   a clock buffer for generating an internal clock signal according to an external clock signal when said clock activation signal is active, wherein
      the input buffer is set to a non-operating state when said internal clock enable signal is inactive, and
      said clock activation signal is activated after said external clock enable signal is held in an inactive state for a prescribed period of time.

9. The semiconductor device according to claim 8, wherein said external enable clock signal is held at an inactive state in a low power operation mode, and the input buffer has an operation current flowing path cut off in response to inactivation of said internal clock enable signal.

10. The semiconductor device according to claim 9, wherein
    said semiconductor device is a clock synchronous semiconductor memory device operating in synchronization with said external clock signal, and
    said low power operation mode is an operation mode in which access to said semiconductor memory device is ceased.

11. The semiconductor device according to claim 1, wherein said received signal comprises an externally applied signal.

12. The semiconductor device according to claim 1, wherein said received signal comprises an externally applied signal and an internal control signal activating the input buffers.

13. A semiconductor device comprising:
    signal input circuitry including an input buffer for buffering a signal provided externally and generating an internal signal when the signal input circuitry is active;
    register circuitry for storing a signal specifying whether control on said signal input circuitry by an operation activation signal is valid, said operation activating signal indicating whether an external signal is a valid signal; and an activation control circuit for selectively activating said signal input circuitry according to said operation activation signal and the signal stored in said register circuitry, said activation control circuit selectively activating said signal input circuitry according to said operation activation signal when the stored signal in said register circuitry indicates that control of activation and deactivation on said signal input circuitry by said operation activation signal is valid, and holding said signal input circuitry in an active state all the times when said stored signal in said register circuitry indicates that the control on said signal input circuitry by said operation activation signal is invalid.

14. The semiconductor device according to claim 13, wherein said activation control circuit controls activation and deactivation of said input buffer.

15. The semiconductor device according to claim 13, wherein said signal input circuitry comprises a next stage buffer circuit for further buffering an output signal of said input buffer, and said activation control circuit controls activation and deactivation of said next stage buffer circuit.

16. The semiconductor device according to claim 13, wherein said semiconductor device is a synchronous semiconductor memory device operating according to a clock signal, and said operation activating signal is a chip select signal indicating that said semiconductor memory device is selected.

17. A semiconductor device comprising:

a buffer circuit for buffering a signal provided externally when active;

a clock buffer for generating an internal clock signal according to an external clock signal when a clock enable signal is active;

clock detection circuitry for detecting whether said clock enable signal is held inactive for a prescribed period of time in a low power operation mode; and control circuitry for setting said buffer circuit and said clock buffer to an inactive state in response to a detection signal of said clock detection circuitry.

18. The semiconductor device according to claim 17, wherein said semiconductor device is a clock synchronous semiconductor memory device operating in synchronization with said external clock signal, and said low power operating mode is an operating mode in which access to said semiconductor memory device is ceased.

19. The semiconductor device according to claim 17, wherein said clock detection circuitry comprises a circuit for deactivating said detection signal in response to activation of an external clock enable signal, said control circuitry deactivates an activation control signal in response to said detection signal and activates said activation control signal in response to said external clock enable signal said external clock signal, and said buffer circuit and said clock buffer operate when said activation control signal is active and generate a corresponding internal signal according to a applied signal when active.

20. The semiconductor device according to claim 11, wherein said control circuitry deactivates said activation control signal according to said external clock enable signal when said external clock signal is at a first logical level.

* * * * *

UNITED STATES PATENT AND TRADEMARK OFFICE
CERTIFICATE OF CORRECTION

PATENT NO. : 6,697,296 B2
DATED : February 24, 2004
INVENTOR(S) : Junko Matsumoto et al.

It is certified that error appears in the above-identified patent and that said Letters Patent is hereby corrected as shown below:

Column 30,
Line 30, change "claim 11" to -- Claim 19 --

Signed and Sealed this

Nineteenth Day of October, 2004

JON W. DUDAS
*Director of the United States Patent and Trademark Office*